US011536776B2

(12) United States Patent
Ulrich et al.

(10) Patent No.: US 11,536,776 B2
(45) Date of Patent: Dec. 27, 2022

(54) METHODS AND APPARATUS FOR SERVICING WELDING EQUIPMENT

(71) Applicant: ILLINOIS TOOL WORKS INC., Glenview, IL (US)

(72) Inventors: Mark A. Ulrich, New London, WI (US); Bernard J. Vogel, Troy, OH (US); David Prey, Appleton, WI (US)

(73) Assignee: ILLINOIS TOOL WORKS INC., Glenview, IL (US)

( * ) Notice: Subject to any disclaimer, the term of this patent is extended or adjusted under 35 U.S.C. 154(b) by 525 days.

(21) Appl. No.: 16/555,636

(22) Filed: Aug. 29, 2019

(65) Prior Publication Data

US 2020/0072913 A1 Mar. 5, 2020

Related U.S. Application Data

(60) Provisional application No. 62/725,699, filed on Aug. 31, 2018.

(51) Int. Cl.
*G01R 31/40* (2020.01)
*B23K 9/10* (2006.01)
*B23K 9/095* (2006.01)

(52) U.S. Cl.
CPC .......... *G01R 31/40* (2013.01); *B23K 9/0956* (2013.01); *B23K 9/1012* (2013.01)

(58) Field of Classification Search
CPC ...... G01R 31/40; G01R 31/50; B23K 9/0956; B23K 9/1012; B23K 9/1043; B23K 9/32; B23K 37/00; B23K 9/10

USPC .................... 324/764.01, 537, 500
See application file for complete search history.

(56) References Cited

U.S. PATENT DOCUMENTS

| | | | |
|---|---|---|---|
| 4,859,932 A | 8/1989 | Whitley | |
| 10,828,718 B2 * | 11/2020 | Bales | B23K 15/0093 |
| 2002/0198667 A1 | 12/2002 | Dodge | |
| 2012/0111837 A1 * | 5/2012 | Al-Mostaneer | B23K 9/0284 219/73 |
| 2015/0053660 A1 * | 2/2015 | Schartner | B23K 9/1062 219/130.1 |
| 2017/0059638 A1 | 3/2017 | Griffiths | |
| 2019/0303884 A1 * | 10/2019 | Böttcher | G06F 1/163 |
| 2019/0337081 A1 * | 11/2019 | Anders | B23K 9/1062 |
| 2020/0101554 A1 * | 4/2020 | Vogel | H02M 7/12 |

OTHER PUBLICATIONS

PCT,Notification of Transmittal of the International Search Report and the Written Opinion of the International Searching Authority, or the Declaration, in PCT/US2019/049098, dated Mar. 9, 2020 (11 pages).

* cited by examiner

*Primary Examiner* — Giovanni Astacio-Oquendo
(74) *Attorney, Agent, or Firm* — McAndrews, Held & Malloy, Ltd.

(57) ABSTRACT

A low voltage system and method for servicing welding equipment including a service tool that may provide a low voltage power source to the welding equipment, enabling the welding equipment to be tested in a low voltage mode of operation. The service tool may also run various test sequences on the welding equipment operating in a low voltage mode of operation to troubleshoot and diagnose any issues with the circuitry of the welding equipment.

20 Claims, 15 Drawing Sheets

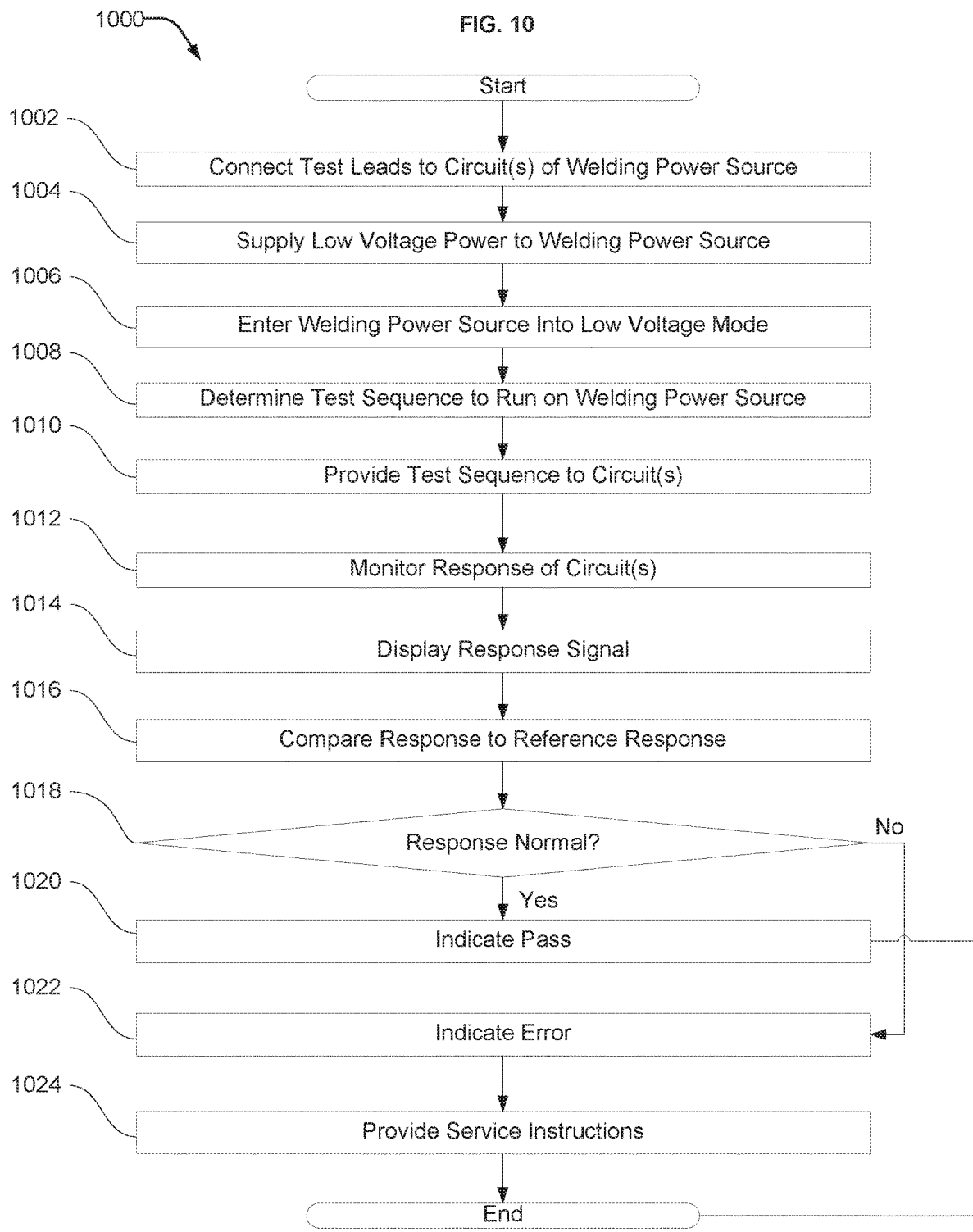

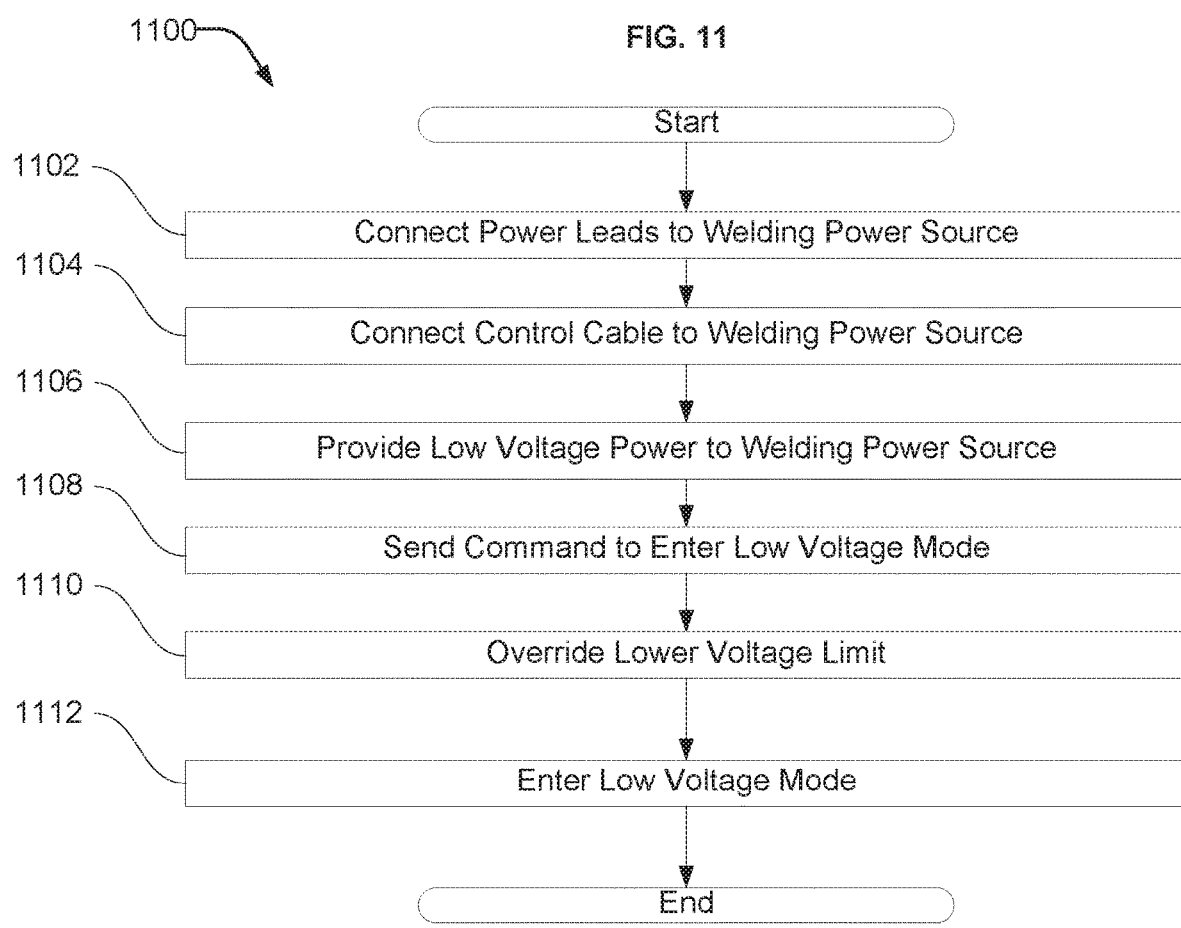

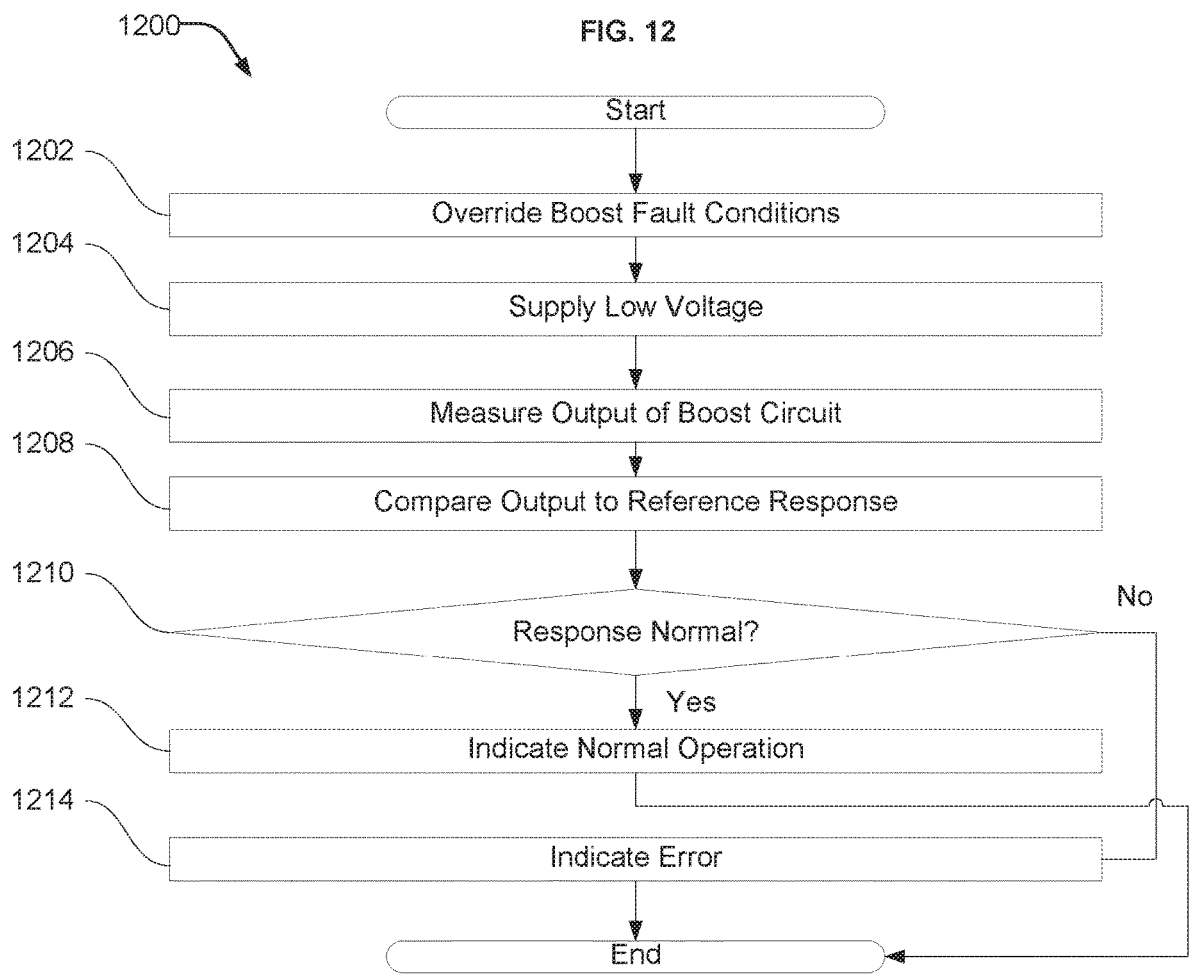

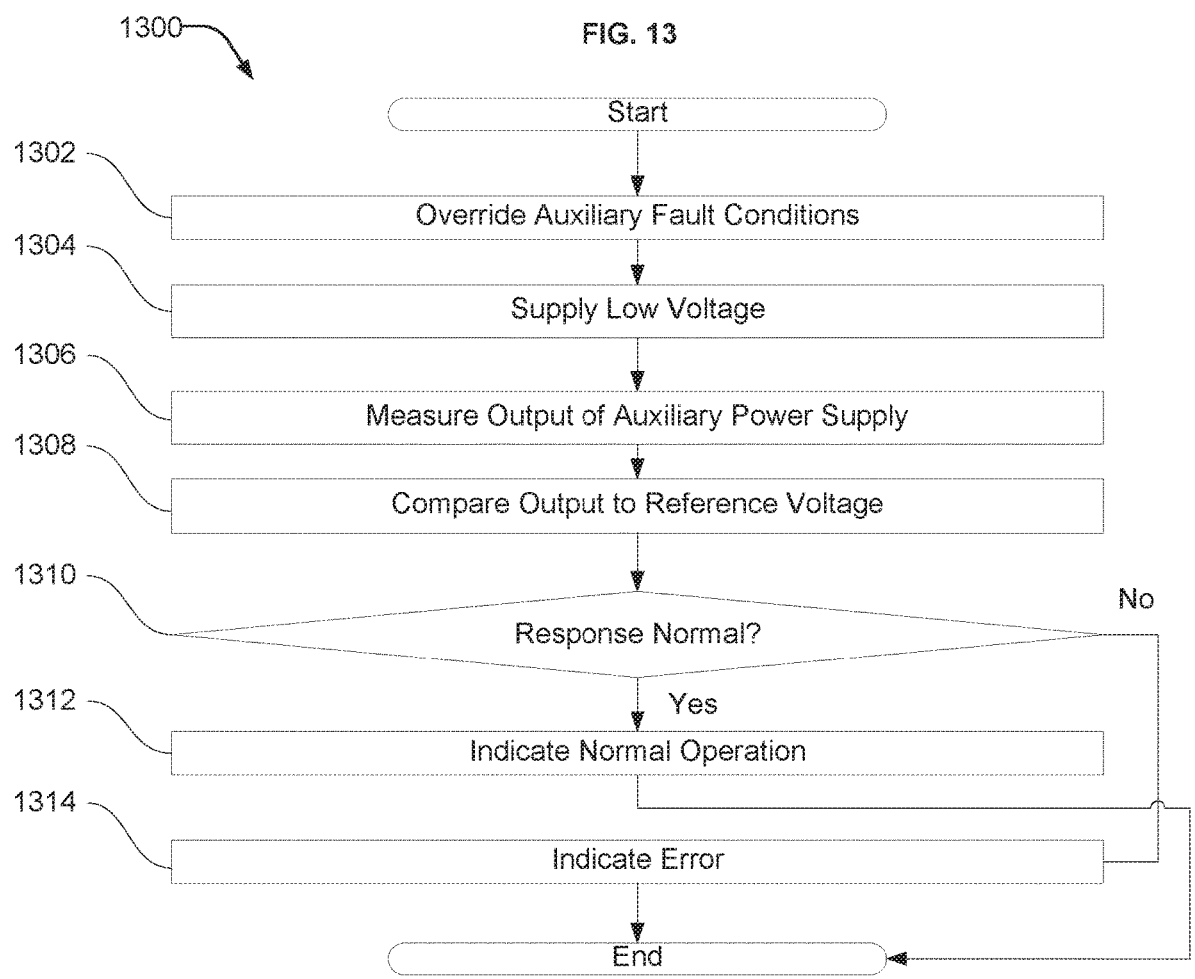

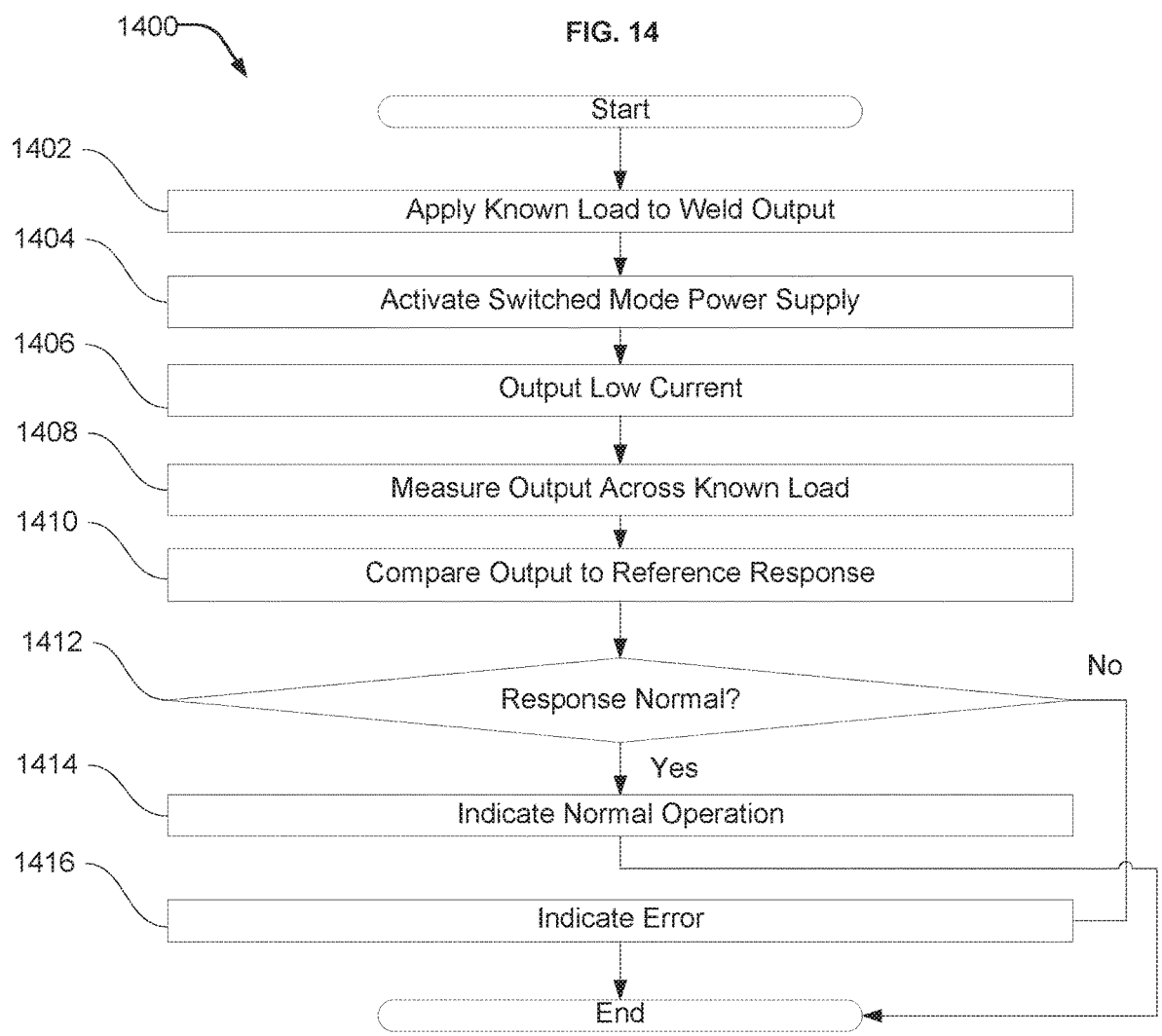

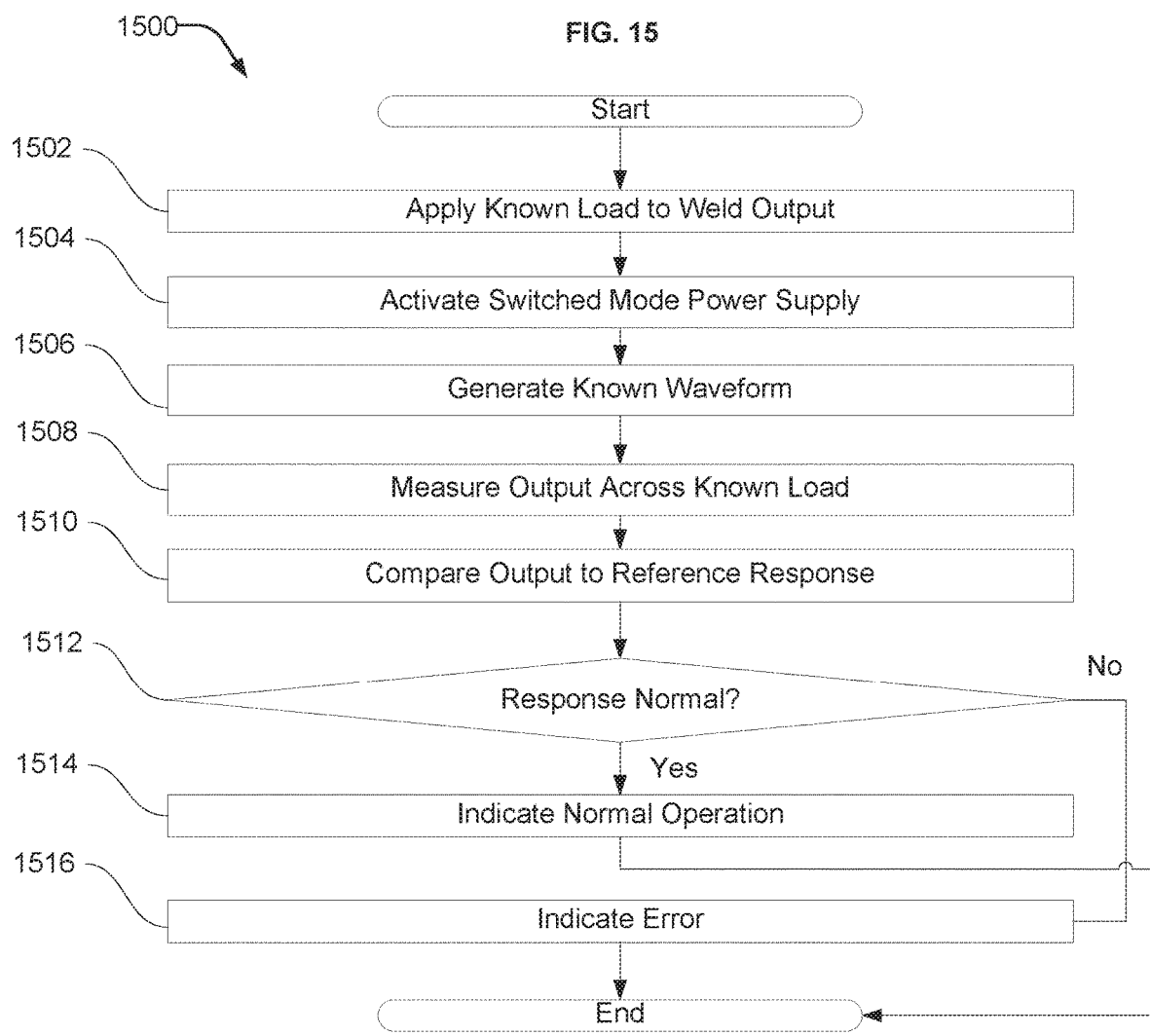

METHODS AND APPARATUS FOR SERVICING WELDING EQUIPMENT

CROSS REFERENCE TO RELATED APPLICATIONS

The present application claims the benefit of U.S. Provisional Patent Application Ser. No. 62/725,699 filed Aug. 31, 2018, entitled "METHODS AND APPARATUS FOR SERVICING WELDING EQUIPMENT." The entire contents of U.S. Provisional Patent Application Ser. No. 62/725,699 are expressly incorporated herein by reference.

BACKGROUND

The present disclosure relates to welding systems and, more particularly, to methods and apparatus for servicing welding equipment.

Welding is a process that has become increasingly ubiquitous in various industries and applications. Many welding power sources and systems can be difficult to service and troubleshoot because of the increased complexity in power conversion circuits, as well as the complexity and sophistication of the control circuits, interfaces, and other features. In addition, the normal operation of a welding power source or system may involve various high voltages that can interfere with the ability of service personnel to adequately troubleshoot or test the system. The condition of a welding power source or other equipment that may be brought in for service or repair is often unknown. It can be difficult and/or undesirable to power up the equipment in the conventional manner when servicing or troubleshooting a welding power source or system. Therefore, an improved method and apparatus for servicing and troubleshooting a welding power source or system is desirable.

SUMMARY

Methods and apparatus for servicing and troubleshooting welding equipment are disclosed, substantially as illustrated by and described in connection with at least one of the figures, as set forth more completely in the claims.

BRIEF DESCRIPTION OF THE DRAWINGS

FIG. 10 is a flow chart of an example method of using a service tool to run a test sequence on a welding power source in accordance with aspects of this disclosure.

FIG. 11 is a flow chart of an example method of entering a welding power source into a low voltage mode of operation.

FIG. 12 is a flow chart of an example method of using a service tool to test a boost pre-regulator circuit of a welding power source.

FIG. 13 is a flow chart of an example method of using a service tool to test an auxiliary power supply of a welding power source.

FIG. 14 is a flow chart of an example method of using a service tool to test a switched mode power supply of a welding power source.

FIG. 15 is a flow chart of an example method of using a service tool to test a switched mode power supply of a welding power source.

The figures are not necessarily to scale. Where appropriate, similar or identical reference numbers are used to refer to similar or identical components.

DETAILED DESCRIPTION

Figure 1:
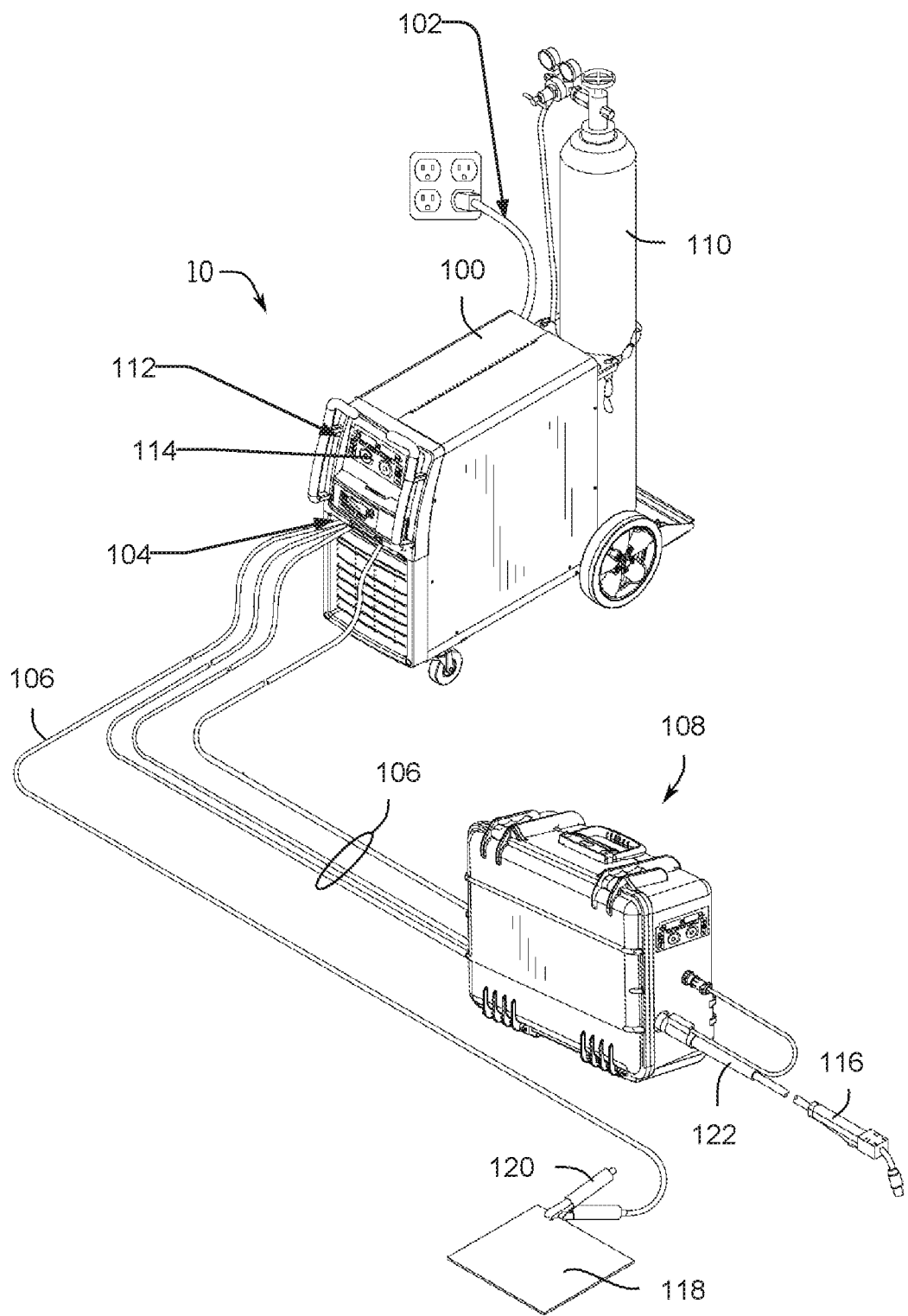
FIG. 1 is an illustration of an example welding-type system in accordance with aspects of this disclosure.

As described above, when servicing or troubleshooting welding-type power supplies, welding power sources, and/or welding power systems ("welding power source"), it can be difficult or undesirable to power up the welding power source in the conventional manner. To avoid these undesirable conditions, a service technician may perform certain pre-power inspections or checks, for example by using a volt-meter to look for short-circuited and/or open-circuited components of the welding power source. However, with the increased level of complexity in the power conversion and control circuits of the welding power source, it can be difficult or challenging for even experienced service technicians to adequately assure all components of the welding power source are functioning properly. This challenge has become even more pertinent as more of the control and features of the welding power source are performed or implemented in firmware and/or software, such as by using microprocessors, FPGAs, systems-on-a-chip (SoCs), and/or other software-based solutions. In many cases, the welding power source control is expected to confirm certain voltage or current levels on various signals throughout the welding power source while the welding power source control executes a power up sequence. If certain components have failed or otherwise do not provide the expected signal levels, then execution of the power up sequence may be halted with little or no indication of the underlying cause.

The present disclosure provides improved methods and apparatus for servicing and troubleshooting a welding power source. For example, disclosed example servicing tools provide sets of necessary signals to test a welding power source, and coordinate test steps and/or procedures with features and/or procedures built into welding power sources.

Disclosed exampled service tools for servicing a welding-type power supply include: test leads configured to connect to one or more circuits in a welding-type power supply; a power supply circuit configured to supply a low voltage power to the welding-type power supply operating in a low voltage mode of operation via two or more power leads; and a control circuit configured to measure one or more aspects of the one or more circuits in the welding-type power supply via the test leads while the welding-type power supply is in a low voltage mode of operation In some example service tools, the control circuit is configured to: provide a test sequence to a first one of the one or more circuits in the welding-type power supply via the test leads; monitor a response of the welding-type power supply to the test sequence via the test leads; and compare the monitored response to a reference response to determine whether the one or more circuits are operating properly.

In some example service tools, the control circuit is configured to identify components of the welding-type power supply that are not operating properly based on the compared monitored response and reference response.

In some example service tools, the control circuit is configured to output, to an operator via at least one of a user interface or communications circuitry, user-readable service instructions based on identification of one or more components of the power supply that are not operating properly. In some example service tools, the control circuit is configured to output, to an operator via at least one of a user interface or communications circuitry, user-readable instructions for connecting the service tool to the welding-type power supply based on identification of one or more components of the power supply that are not operating properly. In some example service tools, the control circuit is configured to output, to an operator via at least one of a user interface or communications circuitry, the results of the test sequence. In some example service tools, the control circuit is configured to output, to an operator via at least one of a user interface or communications circuitry, a signal of the reference response and a signal of the monitored response.

In some example service tools, the test sequence comprises providing a preset input voltage to a switched mode power supply of the welding-type power supply, and wherein the monitored response comprises the output voltage of the switched mode power supply. In some example service tools, the test sequence comprises inputting waveforms into one or more circuits of the welding-type power supply, and wherein the monitored response comprises waveforms detected with the test leads at the outputs of the one or more circuits of the welding-type power supply.

Some example service tools further include a battery configured to supply power to the power supply circuit.

In some example service tools, the control circuitry is configured to receive, from at least one of a user interface or communications circuitry, a selection of a test sequence to provide to the welding-type power supply.

In some example service tools, the power supply circuit is configured to provide low voltage operational power to at least one of a boost pre-regulator power circuit of the welding-type power supply, a switched mode power supply of the welding-type power supply, or a commutator of the welding-type power supply.

In some example service tools, the service tool is configured to provide a predetermined load across output connections of the welding-type power supply, and wherein the test sequence comprises operating the welding-type power supply with the known load.

Some example service tools further include communications circuitry configured to connect with one of a smartphone, tablet, or personal computer, the control circuit configured to receive an input via the communications circuitry.

In some example service tools, the control circuit is configured to cause the welding-type power supply to enter into the low voltage mode of operation by overriding a lower limit of a controller of the welding-type power supply.

In some example service tools, the control circuit is further configured to identify the welding-type power supply, and wherein the test sequence and the reference response are selected based on the identified welding-type power supply.

In some example service tools the control circuit is configured to control the power supply circuit to output power via the power leads to supply low voltage power to the welding-type power supply operating in a low voltage mode of operation.

Disclosed methods include: connecting test leads to one or more circuits in a welding-type power supply; supplying a low voltage power to the welding-type power supply operating in a low voltage mode of operation, via two or more power leads; and measuring one or more aspects of the one or more circuits in the welding-type power supply, via control circuitry connected to the test leads, while the welding-type power supply is in a low voltage mode of operation.

Some disclosed methods further include: providing a test sequence to a first one of the one or more circuits in the welding-type power supply via the test leads; monitoring a response of the welding-type power supply to the test sequence via the control circuitry; and comparing, via the control circuitry, the monitored response to a reference response to determine whether the one or more circuits are operating properly.

In some disclosed methods, providing a test sequence includes inputting waveforms into selected circuits of the welding-type power supply, and the monitoring the response includes measuring waveforms at the outputs of the selected circuits of the welding-type power supply.

Some disclosed methods further include identifying the welding-type power supply via the control circuitry, and wherein the test sequence and the reference response are selected based on the identified welding-type power supply.

FIG. 1 illustrates an exemplary welding type system 10 including a welding power source 100. A source of power is provided to the welding power source 100 via an AC power cord 102. Typical ranges of AC power may be 115/230 VAC or 208-575 VAC, and may include single-phase or three-phase power. The welding power source 100 generally supplies power for the welding-type system 10. Weld output 104 provides welding output power via one or more weld cables 106 coupled to a welding torch 116 and a workpiece 118 using a clamp 120. Welding output power may be in the range of 10 Amps to 600 amps or more, and range from 0 volts at short circuit to 44 volts or more into an open welding arc. Modern welding power sources and systems can provide welding type power for various weld processes which may include advanced waveform generation and control that is responsive to dynamic or static conditions at the welding arc.

The illustrated welding type system includes a wire feeder 108 and a gas supply 110. The welding power source 100 may provide power and control to other equipment such as a wire feeder 108. In the illustrated example, the welding torch 116 is coupled to the wire feeder 108 via coupler 122 in order to supply welding wire, shielding gas from the gas supply 110, and/or welding-type power to the welding torch 116 during operation of the welding-type system 10. In some examples, the welding power source 100 may couple and/or directly supply welding-type power to the welding torch 116. The wire feeder 108 may require a certain type of power, for example, 24V or 50V for proper operation of the wire feeder 108 control circuits. The power for the wire feeder 108 may be provided by the welding power source 100 by a wire feeder 108 power supply circuit, or another type power circuit. In addition to power for the wire feeder 108, one or more control signals may also be provided to allow proper operation of the wire feeder 108 and welding power source 100. These control signals may be analog or digital and may provide control and communication in a bi-directional manner. The power and control signals may be provided to the wire feeder 108 from the welding power source via cable(s) 106.

The illustrated welding power source 100 has a control panel 112 with various types of control features 112, such as digital displays, control dials or potentiometers, control switches, LED indicators, etc. These control features 112 provide for normal operation and control of the welding system. In addition, these control features are used to signal or indicate an internal fault or abnormal condition that has been detected with the welding power source 100. For example, an LED indicator may be lit for a thermal overload condition, if the output capability or rating of the power source has been exceeded.

Figure 2:
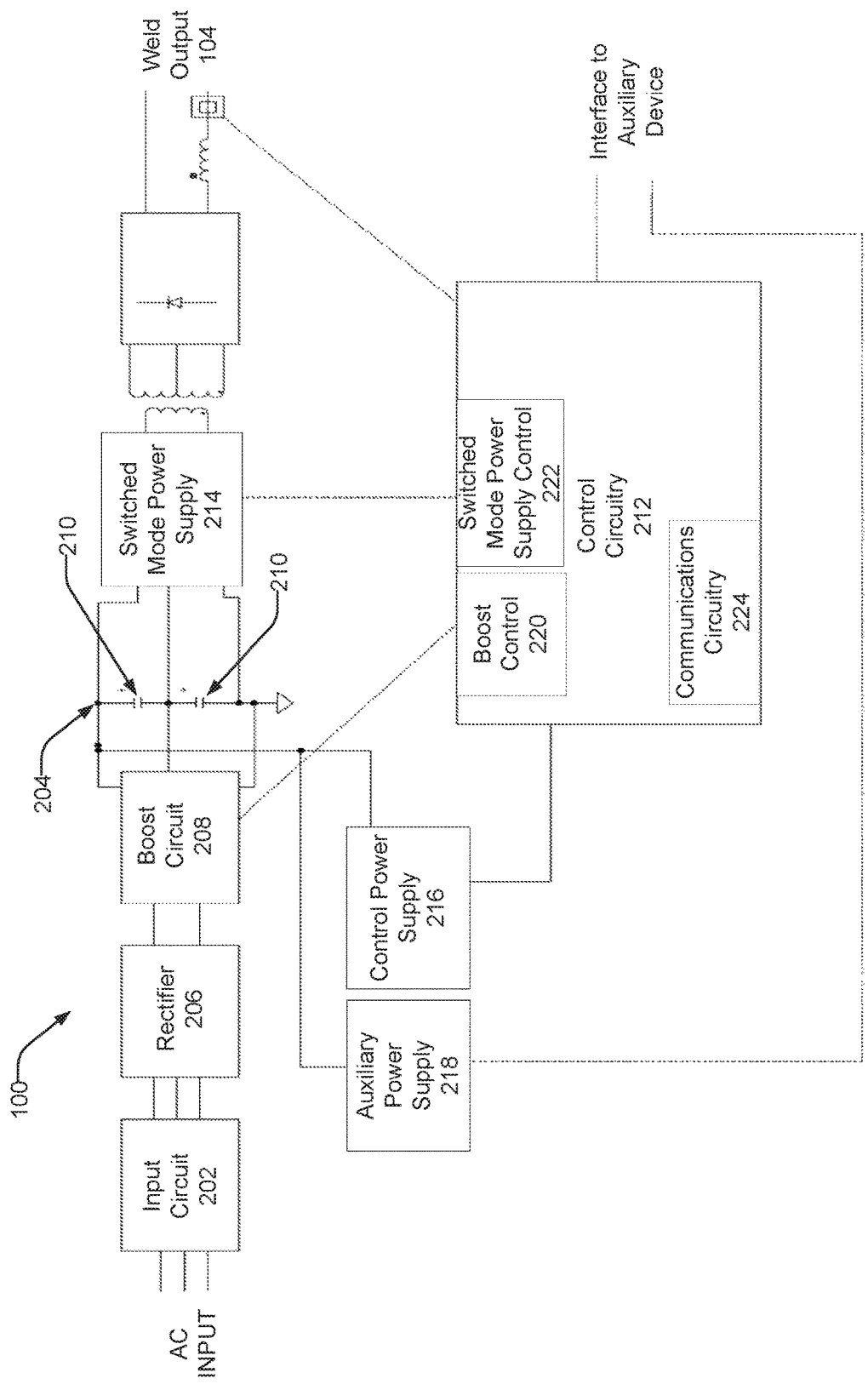
FIG. 2 is a block diagram of the example welding-type system of FIG. 1.

FIG. 2 is a block diagram of an example implementation of the welding power source 100 of FIG. 1. AC power input is provided to an input circuit 202. In the illustrated example, the input power is three-phase power having a voltage in the range of 230-575 VAC. However, other examples may have different input voltages and/or single phase power (e.g., 120 VAC single phase).

An input circuit 202 receives the input power, and may include a switch or other circuitry to disconnect the AC power from the welding power source 100. The input circuit 202 may include pre-charge circuitry (e.g., to pre-charge or soft charge a DC bus 204), filter chokes and/or capacitors, ground fault circuit interruption circuitry, surge protection, power factor correction, and/or any other power conditioning circuitry for receiving the input power.

The input circuit 202 provides the input power (e.g., conditioned input power) to an input rectifier 206 of various configurations such as a full bridge rectifier. The example welding power source 100 includes a boost or pre-regulator circuit 208 that takes the output voltage signal from the input rectifier 206 and boosts and/or regulates the output voltage signal from the input rectifier 206 to provide a consistent voltage on the DC bus 204. The DC bus voltage (Vbus) may be supplied to one or more series capacitors 210, such that each capacitor 210 supports a percentage of the total DC bus voltage. For example, two capacitors 210 in series may be expected to each support nominally one-half of the total bus voltage (e.g., top and bottom bus voltage). Example boost or other pre-regulator circuits include a single boost, an interleaved boost, or a stacked boost circuit, though other boost topologies may be used. The boost circuit 208 may include power transistors (e.g., integrated gate bipolar transistors (IGBTs), metal-oxide-semiconductor field effect transistors (MOSFETs), etc.), silicon controlled rectifiers (SCRs), and/or other power semiconductors that can be switched (e.g., by control signals from control circuitry 212) to control operation of the boost circuit 208 and provide the regulated DC bus voltage. Typical DC bus voltages may be 400-440 VDC for systems utilizing 115/230 VAC power, or 800-940 VDC for welding power supplies provided with 208-575 VAC power. However, other bus voltages may be used depending on the application. The normal operating voltage of the DC bus 204 may be considered a high voltage, which can complicate the servicing and/or troubleshooting of the welding power source 100.

Operation of the boost circuit 208 may involve feedback signals, such as boost current feedback, DC bus voltage measurements, top and/or bottom bus voltage measurements for a series capacitor arrangement, measurements of the rectified voltage supplied by the input rectifier, and/or other feedback signals. The normal operation of a boost circuit 208 may also require certain interfaces and power supply signals. These may include positive and/or negative control power supplies (e.g., +/−15V), gate drive interlock signals to assure the gate drive signal is supplied to the power semiconductor, temperature sensor signals, and/or other signals. If one or more necessary signals are not present, or do not present acceptable values, the boost circuit 208 may not operate properly. For example, the boost circuit 208 may be prohibited from operating if the voltage output from the input rectifier 206 is not of sufficient magnitude, or if the top and bottom bus voltages for a series arrangement of DC bus capacitors 210 differ by more than a threshold amount. Supplying the welding power source 100 with the full AC power input, as required for normal operation of the welding power source 100, may result in additional failed components and/or hamper troubleshooting if necessary signals are not present are not at correct levels.

A switched-mode power supply circuit 214 converts the bus voltage to welding type power. Welding power sources including switched-mode power supply circuits are also referred to as inverter-type welding power sources. Example switched-mode power supplies may include half-bridge topologies, full-bridge topologies, forward converter topologies, and are controlled to convert the DC bus voltage to welding-type power, which involves reducing the voltage and increasing the current. The switched-mode power supply circuit 214 may employ gate drive circuits, and may be controlled via PWM control signals to drive power semiconductors. The switched-mode power supply circuit 214 may utilize other signals for operation in a manner similar to the boost circuit 208. These may include +− control power supplies (e.g., +−15V), gate drive interlock signals to assure the gate drive signal is supplied to the power semiconductor, thermal sensors, weld output signals such as current or voltage feedback signals, etc. These signals may also be required for proper welding operation and generation of the waveform control signals. In many cases these signals and waveform generation are processed and generated in software using microprocessors or other circuits, which can make it difficult to troubleshoot and service the welding power source 100 to assure proper operation of these various circuits and signals. The switched-mode power supply circuit 214 may be prohibited from operating by the control circuitry 212 if one or more of the signals required for proper operation is not present or not of the correct magnitude. This may include for example the DC bus voltage.

The welding power source 100 may include an additional control power supply 216 or auxiliary power supply(s) 218 to provide the necessary control power signals to a control circuitry 212, wire feeder 108, or other circuits. Control power supply 216 and auxiliary power supply 218 may be supplied with the DC bus voltage, the input AC power, or rectified AC voltage. Control power supply 216 and auxiliary power supply 218 may utilize one or more switched mode power supplies to convert the DC bus or other source of power to the required control or auxiliary voltage and current levels required. Control power supply 216 and auxiliary power supply 218 may include fly-back, forward converter, full or half-bridge, buck or boost regulators, etc. As such these power supplies require DC bus voltage or AC power to be supplied and of a certain magnitude for their proper operation.

The welding power source includes control circuitry 212 including one or more circuit boards (PCB), as well as microprocessors and software. The control circuitry 212 may require one or more voltage signals to be supplied from a control power supply 216 for operation (e.g., +5V, +3.3V, +-15V, +-24V, etc.) The control power supply 216 and control circuitry 212 may operate on different circuit commons and require reinforced insulation for proper operation under normal conditions (i.e., welding power source 100 functioning normally and supplied with a source of AC power). For example, a boost pre-regulator control circuit 220 may be reference directly to the DC bus and as such the DC bus is the circuit common. A switched mode power supply control circuit 222 may be referenced to the welding circuit or to a protective circuit such as the frame or chassis of the welding power source 100. These control circuits (i.e. boost pre-regulator control circuit 220 and inverter control circuit 222) are generally separated and electrically insulated from each other.

The control circuitry 212 monitors and processes the various signals mentioned above as well as other signals. The control circuitry 212 also generates PWM or other control signals that provide the gate signals to the power semiconductors for the pre-regulator circuit 208 and switched-mode power supply circuit 214. The control circuitry 212 also provides for a power up sequence where various conditions must be met, or signals at the correct level must be received, before proceeding to a next step in the sequence. For example, the switched-mode power supply circuit 214 that provides the welding power output may be disabled until the boost circuit 208 is operating and the DC bus has reached full voltage (e.g., 940 VDC). Control power supply 216 and auxiliary power supply 218 may also be sequenced and only enabled once a certain step has been reached in the sequence and/or certain voltage levels or other signals indicate normal operation. The control circuitry 212 provides enable signals or other signals to control power supply 216 and auxiliary power supply 218 that enable or disable their operation. The control circuitry 212 may include other features of the welding power source 100 or system such as cooling fan control, user interfaces, LED indicators, weld process control and waveform generation.

The control circuitry 212 may also include communications circuitry 224 which enables communication with external devices, for example a smartphone, a laptop computer, a desktop computer, a tablet PC, etc. Communications circuitry 224 may communicate with an external device via wired or wireless communications networks, such as Wi-Fi, Bluetooth, LAN or other mediums, etc.

Figure 3:
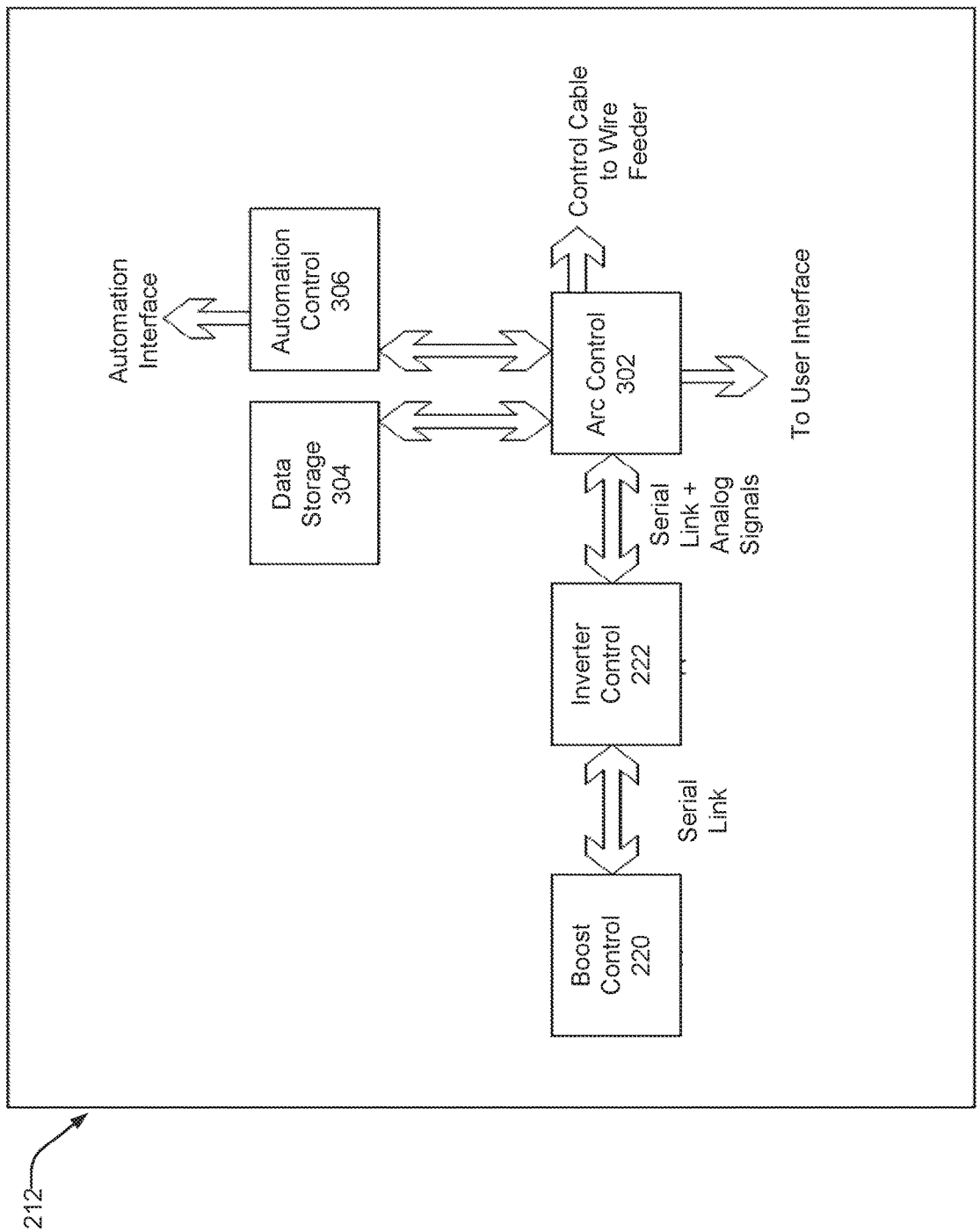
FIG. 3 is a block diagram of an example of control circuitry of the welding-type system of FIGS. 1 and 2.

FIG. 3 shows a block diagram of control circuitry 212. The control circuit may be comprised of one of more PCBs. A boost control circuit 220 provides the necessary signals and generates the PWM gate drive signals as described above. A switched mode power supply control circuit 222 generates PWM gate drive signal and the necessary signals as described above. Signals or information may be exchanged between the boost control circuit 220 and switched mode power supply control circuit 222, for example via a bi-directional serial communication channel.

An arc control circuit 302 generates the necessary control signals to control operation of the switched mode power supply control circuit 222 and switched mode power supply 214, as required to provide a welding type output. The arc control circuit 302 may provide various analog, digital or serial communication signals to the switched mode power supply control circuit 222. The arc control circuit 302 and switched mode power supply control circuit 222 may reside within a common microprocessor in which case these signals may be represented via software.

Control circuitry 212 may also have several other features such as data storage 304, weld sequence operation, automation interface 306, communication network interfaces such as Wi-Fi_33, LAN or other mediums, web pages, interface to other components within the welding system such as wire feeders, user interfaces, etc.

Figure 4:
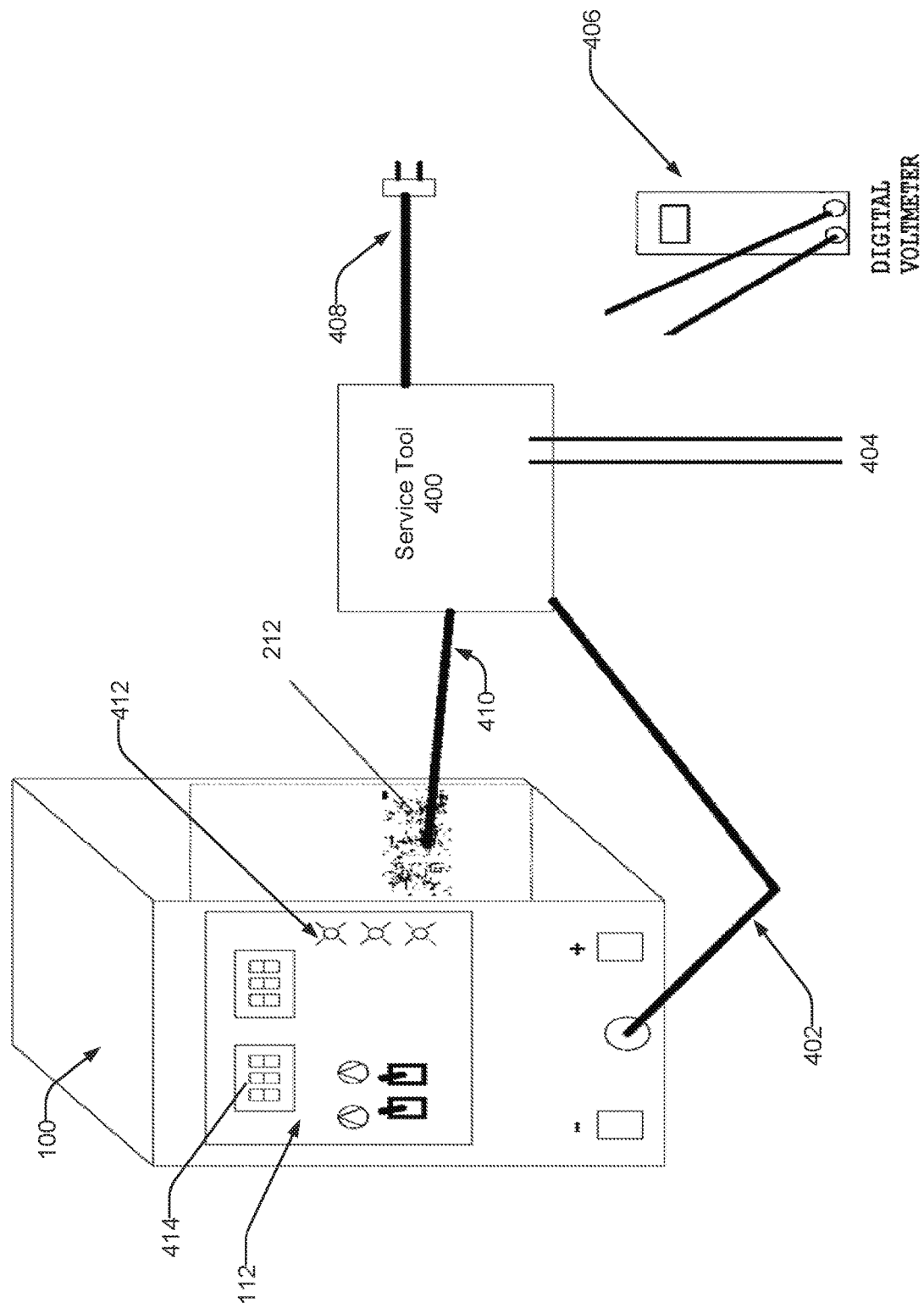
FIG. 4 is an illustration of an example low voltage system for servicing a welding power source.

FIG. 4 illustrates an example system including a service tool 400 that may be used to assist in troubleshooting, service, and/or repair of a welding power source 100. As shown the service tool 400 has various features that allow the service tool 400 to interface to the welding power source 100. The service tool 400 can provide signals and control power supply voltages, that can operate in conjunction with features built into the welding power source 100. The service tool 400 may connect to a readily available source of power such as 115 VAC via a power cord 408, or may be battery powered. In some examples, the service tool 400 provides various control power voltages to control circuitry 212 within the welding power source 100 (e.g., +5V, +-15V, etc.) via cable(s) 410, which may include power leads. In some examples, the service tool 400 provides a set of control voltages via cable(s) 410 sufficient to power up the control circuitry 212. In some examples, as will be described below the service tool 400 provides a more complete set of control voltages to the control circuitry to provide more thorough troubleshooting.

The service tool 400 may provide two or more sets of control voltages to provide power to portions of the welding power source 100 control circuitry 212 that may be insulated or isolated from each other, (e.g., boost control circuit 220 and switched mode power supply control circuit 222 as described above and referenced to different circuit ground or common nodes). In some examples, the service tool 400 provides only one set of control voltages referenced to a single common, even though normal operation of the welding power source requires two sets of isolated control power. Because of the nature of the low power and low voltage supplied by the service tool 400, two control circuits (e.g., boost control circuit 220 and switched mode power supply control circuit 222) may be connected together and operated from a single circuit common. Connecting two control circuits (i.e. boost control circuit 220 and switched mode power supply control circuit 222) simplifies and facilitates measurement of various signals and waveforms.

In the illustrated example of FIG. 4, the service tool 400 interfaces with the welding power source 100 via a control cable 402. Under normal operating circumstances, the control cable 402 connects the welding power source 100 to a wire feeder 108 or a user interface. As such, the service tool 400 provides the necessary signals via the control cable 402 to emulate the functioning of a wire feeder or user interface via the control cable. The control cable 402 also communicates certain commands or a sequence of steps to the control circuitry 212 within the welding power source to facilitate testing or troubleshooting.

Figure 5:
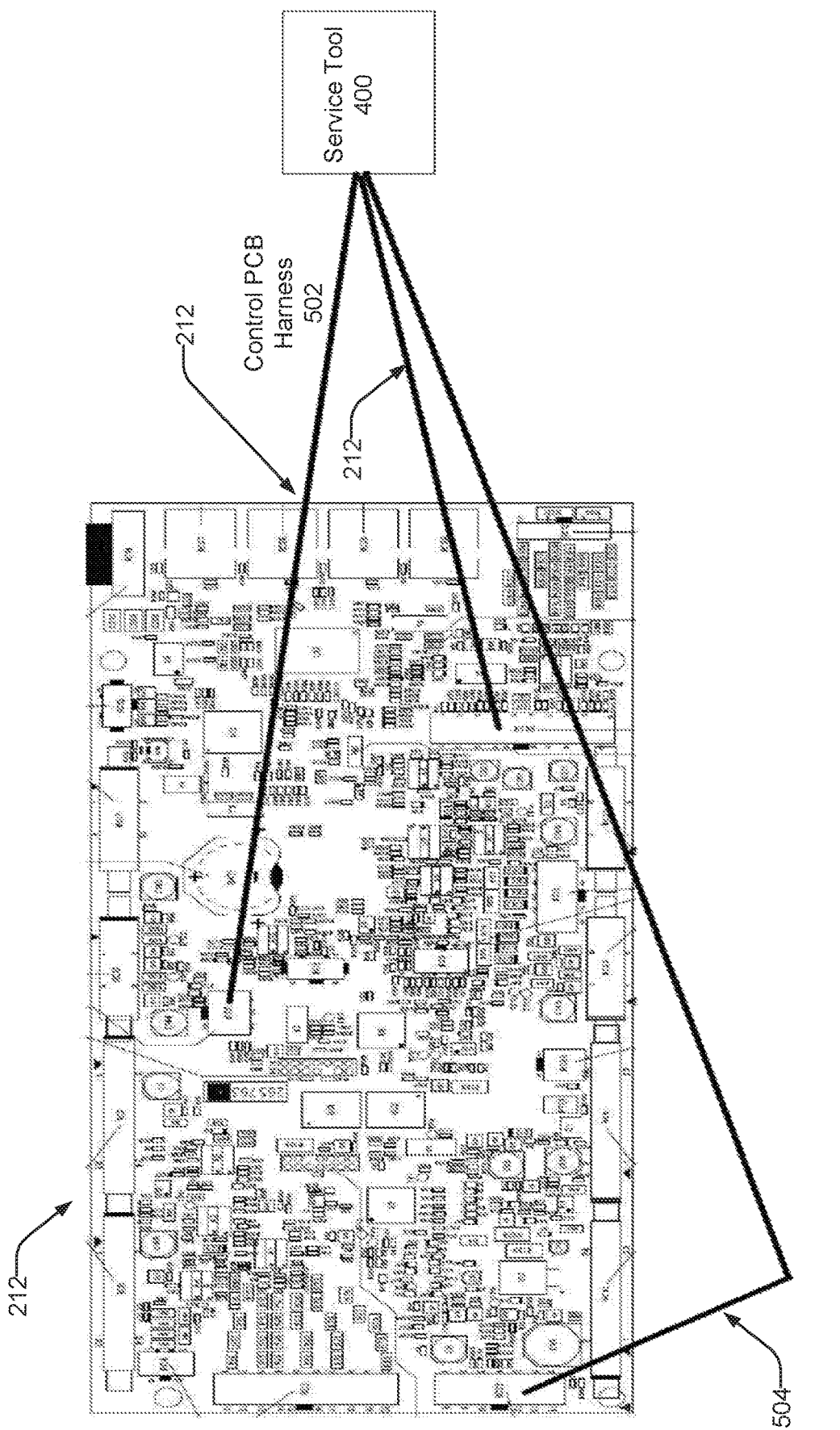
FIG. 5 is an illustration of an example connection between a low voltage service tool and control circuitry of a welding power source.

The service tool 400 may interface directly to one or more connection points on the control circuitry 400 via a test leads 404. In some examples, the service tool 400 interfaces with the control circuitry 212 via a dedicated connector or connectors on the control circuitry 212 intended for interfacing to a service tool. In some examples, the service tool 400 interfaces with the control circuitry 212 by intercepting or replacing one or more of the connectors within the normal wiring harness of the welding power source 100. It may be necessary to remove one or more panels from the welding power source 100 to gain access to these connection points. FIG. 5 illustrates a connection of a service tool 400 to control circuitry 212 (for example a control PCB) via a control PCB Harness 502. As shown in FIG. 5, the service tool 400 can provide signals to several harness connection points 504.

Returning to FIG. 4, the service tool 400 may have a number of other features, such as one or more sets of test leads 404 that can be connected to various elements of the welding power source 100. LED indicators 412 and digital displays 414 on the control panel 112 of the welding power source 100 may also provide feedback about the status of the welding power source. A trained service technician may also use a separate digital VOM 406 to make measurements with the welding power source 100.

The service tool 400 also provides a separate low voltage power signal to the welding power source, for example via the cable(s) 410, that can be connected to the AC power input connection point 202 (see FIG. 2) of the welding power source 100. This low voltage power signal allows for operation of the various power circuits within the welding power source 100 at reduced voltage and power, when used in conjunction with certain built in features of the welding power source 100. Operation of the welding power source 100 at reduced voltage and power allows for verification of the functionality or investigation of failed components of the welding power source 100 at a low voltage condition and limited power condition. Operation of the welding power source 100 at reduced voltage and power therefore eliminates the need for troubleshooting with high voltages present in the welding power source 100.

Figure 6:
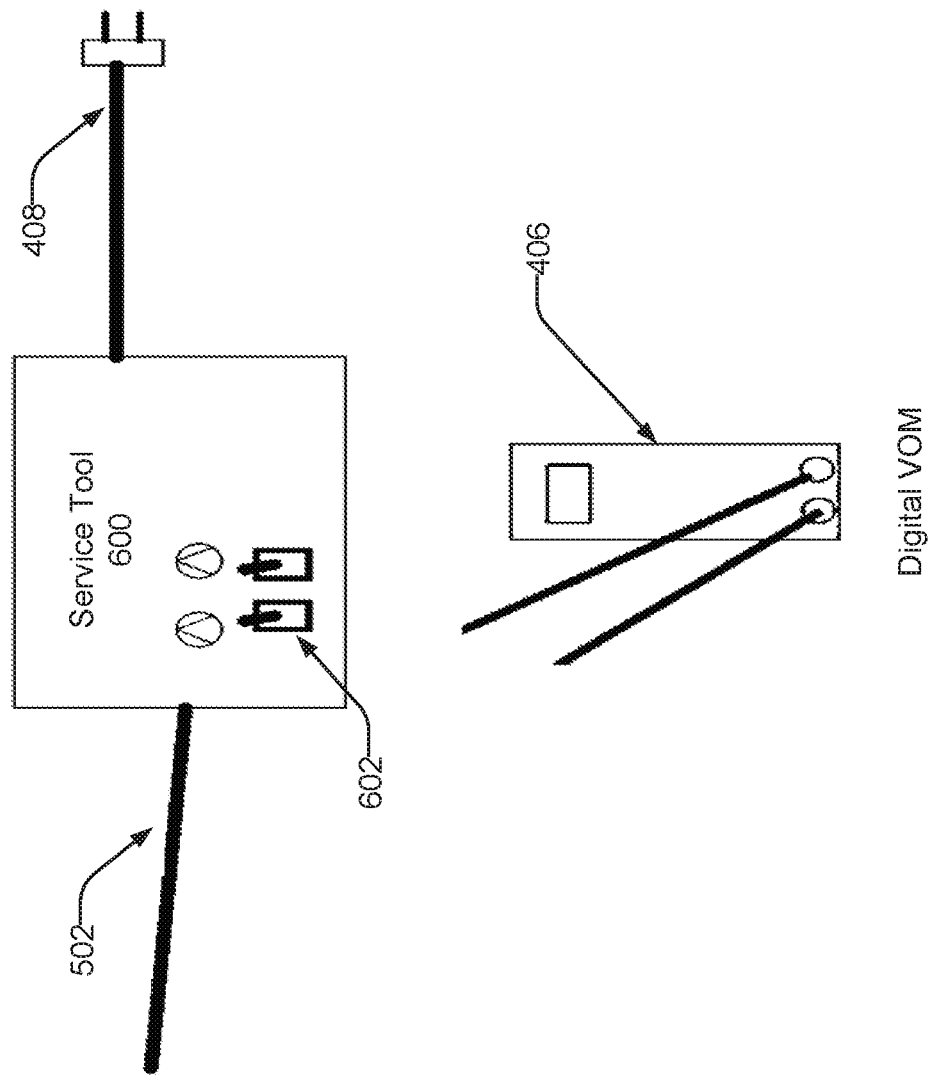
FIG. 6 is an illustration of an example low voltage system for servicing a welding power source.

FIG. 6 shows a service tool 600 that provides a number of control voltages and signals to power up the control circuitry 212 within the welding power source 100. The service tool 600 provides the necessary signals to interface with certain built in features of the welding power source 100. These features may be programed into control circuitry 212 of the welding power source 100. For example, as explained in more detail below, the welding power source has a built in "soft-start" feature that allows the welding power source 100 to operate in a low voltage mode of operation. The service tool 600 supplies a low voltage power signal to the welding power source 100, to allow the welding power source 100 to operate in a low voltage mode of operation. The service tool 600 may also send control signals to the control circuitry 212 which enter the welding power source 100 into a low voltage mode of operation. The service tool 600 may connect to the control circuitry 212 via a control PCB harness 502. Any voltage or other measurements are performed using a separate digital VOM 406 and rely on the expertise of the service technician to troubleshoot the machine.

Figure 7:
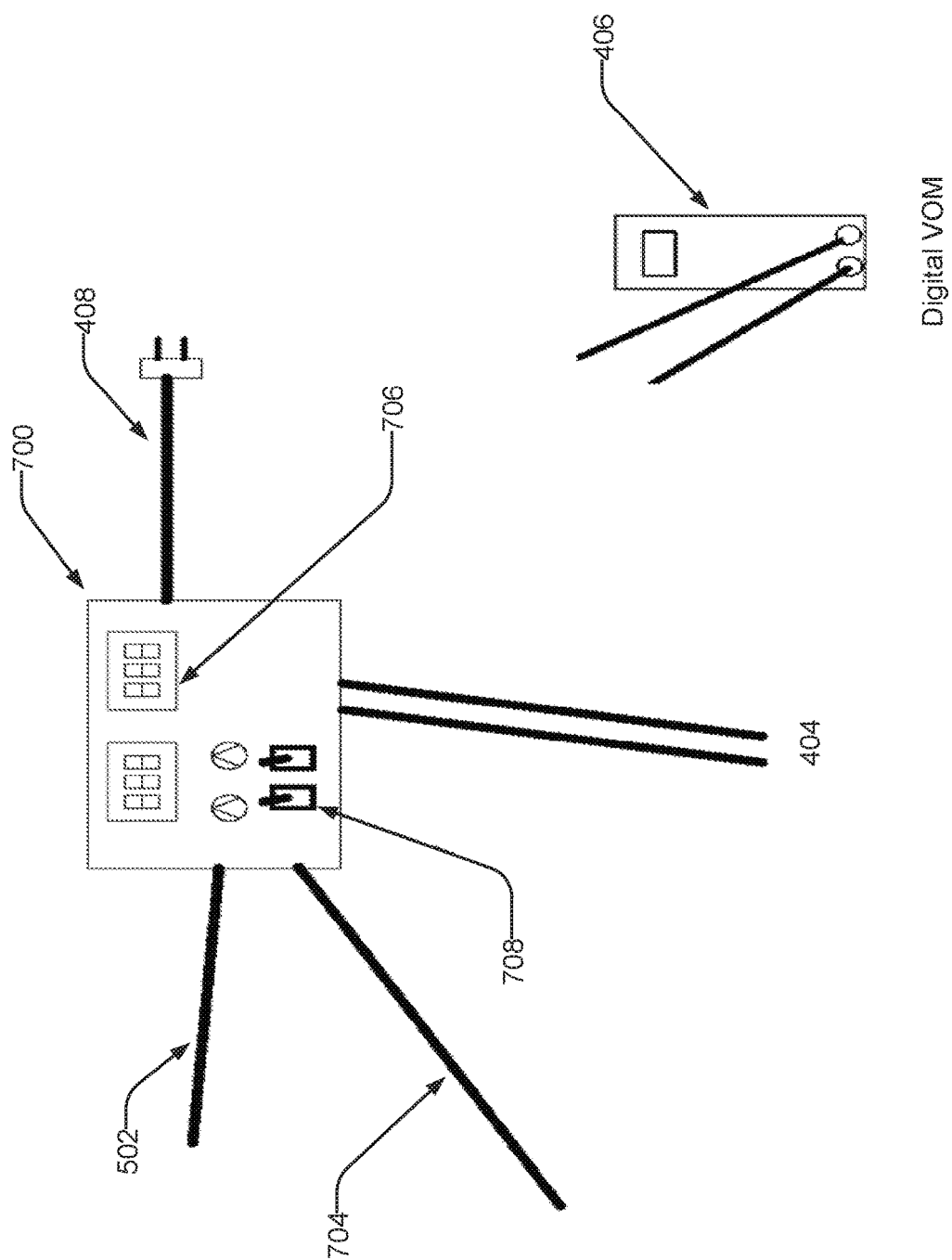
FIG. 7 is an illustration of another example low voltage system for servicing a welding power source.

FIG. 7 illustrates another example service tool 700. The service tool 700 has test leads 404 and interfaces to the welding power source 100, via the control cable 704. The illustrated service tool 700 has built in digital displays 706 that display measurements in place of a separate digital VOM 706. The service tool 700 may provide a sequencing or logical flow of troubleshooting test steps in conjunction or cooperation with features built into the welding power source 100. In some examples, the features are programed into control circuitry 212 of the welding power source 100. The service tool 700 also has controls 708, for example, switches or control potentiometers, which a service technician may use to control the service tool 700.

Figure 8:
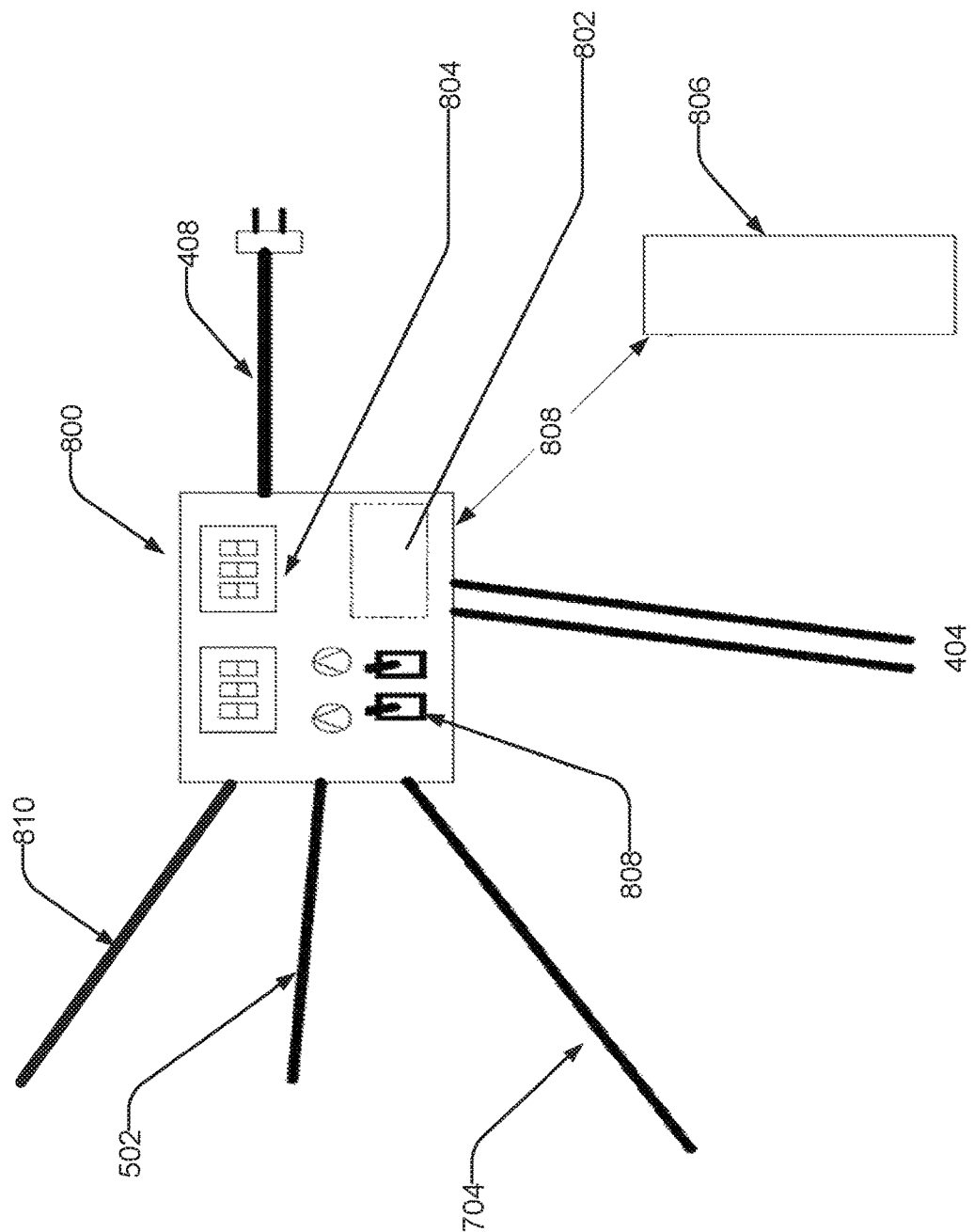
FIG. 8 is an illustration of another example low voltage system for servicing a welding power source.

FIG. 8 illustrates another example service tool 800 with additional features. These features include data acquisition and memory 802 storage features. These features allow the service tool 800 to capture, store and display various voltage or current waveforms or signal levels. The illustrated service tool 800 includes an LCD 804, or other display 804, to display captured and/or measured waveforms. The LCD 804 may be used to display a reference waveform to compare the measured waveform against. The service tool 800 may provide pass/fail criteria by numerically comparing a measurement or captured waveform to a reference signal or waveform. The service tool 800 also includes power leads 810 to supply a low voltage power to the welding power source 100.

The service tool 800 has an interface 808 to communicate with a smartphone 806 or other remote computing device 806. The interface 808 may use a wired connection, Wi-Fi_33, Bluetooth or other communication technology to communicate with the smartphone 806. The smartphone 806 may be used to receive and store measurements that can be saved as a reference or used for calibration of the welding power source 100. The interface 808 allows for connection and communication to a remote location for collaborative troubleshooting, for example with the manufacturer or service center. Waveforms and measurements may be captured by the service tool 800 and communicated to a smartphone 806 via the interface 808 in approximately real time. The waveforms and measurements may then be displayed on the smartphone 806 in approximately real time to assist in servicing and troubleshooting the welding power source 100. Additionally, the service tool 800 may receive a selection of a test or test sequence to run on the welding power source 100 from a service technician. For example, a service technician selects a test sequence to test the boost circuit 208 or the switched-mode power supply 214. The service technician may select the test sequence to run based on selections displayed on the display 804. In some examples, the service technician selects the test sequence to run on a smart phone, laptop, or other portable computing device 806.

Figure 9:
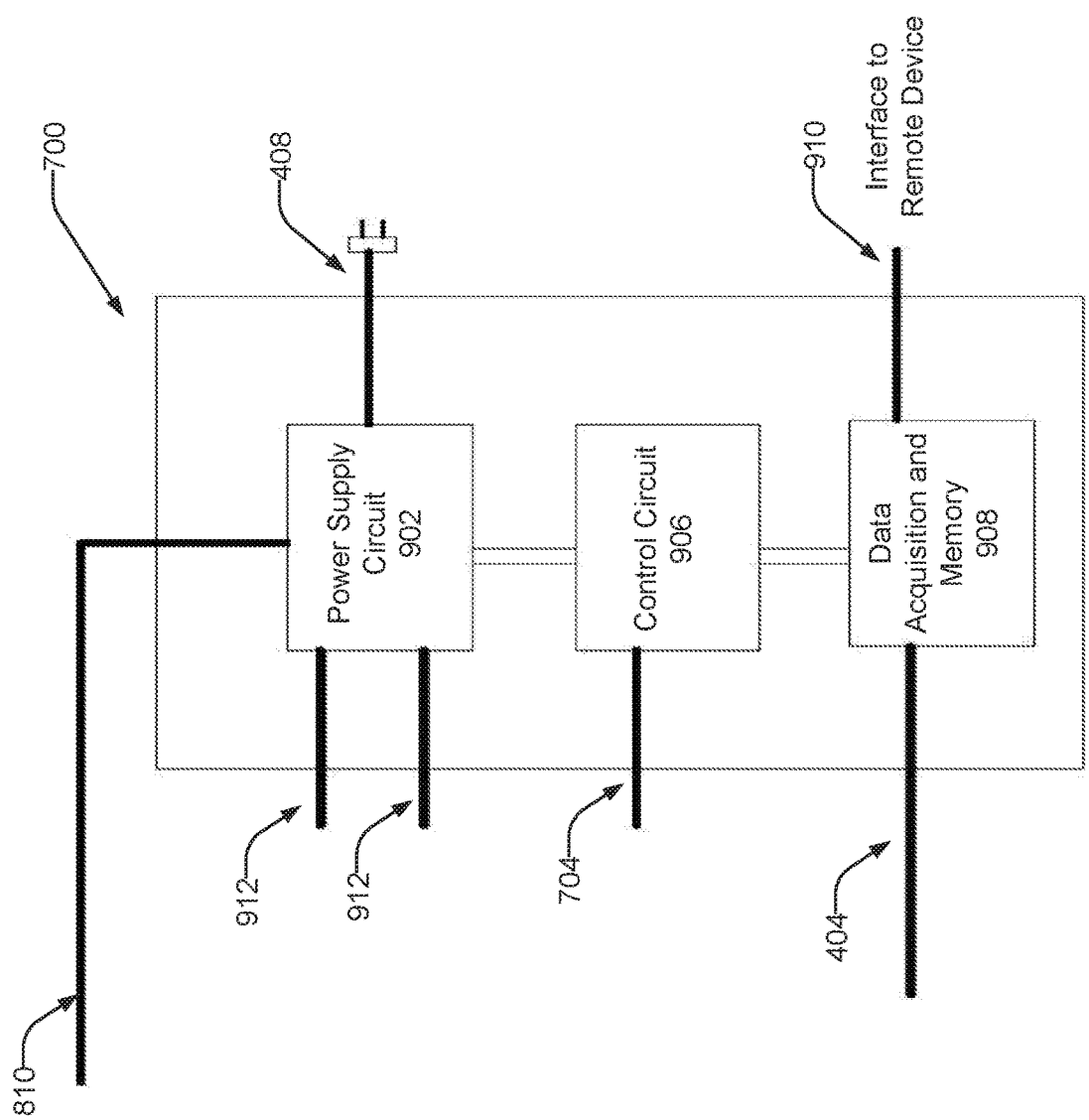
FIG. 9 is a block diagram of an example of a low voltage service tool for servicing a welding power source in accordance with aspects of this disclosure.

FIG. 9 shows an example of a block diagram of a service tool 900. A source of power is provided via a power cord 408 to 115 VAC. In some examples, the service tool 900 is powered by a battery, which provides a cordless service tool 900. The source of power is converted by a power supply circuit 902 to the necessary control voltages required to power the control circuitry 212 of a particular welding power source 100. The power supply circuit 902 may provide multiple sets of control voltages 912 that can be referenced to different circuit common points within the welding power source 100. Control voltages 912 may be for example +5V, +−15V, etc. An additional low voltage power source is supplied by the power supply circuit 902 that can be connected to the AC power input connection 202 of the welding power source 100 via power lead 810. This source of low voltage power may be used to energize certain power circuits within the welding power source 100 at a low voltage, in place of the AC power that is required for normal operation of the welding power source 100.

A logic or control circuit 906 provides the necessary signals to facilitate testing and troubleshooting of the welding power source 100. The necessary signals include one or more signals to activate a "soft-start" feature of the welding power source 100. Other necessary signals may include analog, digital or serial communication signals to activate various circuits within the welding power source 100 and then sequence through various test steps. In the illustrated example, the necessary signals are sent using a control cable 704. In some examples, the necessary signals may be sent using a PCB harness 502, as described above. A user interface on the service tool may be a part of the control circuit 906. A data acquisition circuit 908 combined with data storage or memory, and logic or algorithms can facilitate troubleshooting and service by capturing various waveforms or voltage signals. The control circuit 906 can then compare captured signals or waveforms to reference waveforms or expected values stored in memory 908. An interface 910 allows for communication with external devices such as smart phones, desktop computers, the internet, etc. The external devices can be used to collaborate or assist with the troubleshooting or service operation. The data acquisition circuit 908 also receives data from test leads 404 connected to components of the welding power source 100.

Returning to FIGS. 4-9, the service tool 400 assists in troubleshooting and service of a welding power source 100 by providing signals and controls, and working in conjunction with certain features built into the welding power source. While the operation will be described with reference to the service tool 800 of FIG. 8 and the service tool 900 of FIG. 9, the service tool 400 of FIG. 4, the service tool 600 of FIG. 6, or the service tool 700 of FIG. 7 may also be used to troubleshoot and service a welding power source 100. One feature provided by the service tool (800 of FIG. 8 or 900 of FIG. 9) is a "soft-start" or "slow-start" feature. The "soft-start" or "slow-start" feature allows the welding power source 100 to operate in a low voltage mode of operation where the various power circuits of the welding power source 100 can be operated with a low voltage source of power replacing the AC power normally supplied to the welding power supply 100. Low voltage mode of operation, as used herein, refers to voltages less than the nominal rated operating supply voltage of the welding-type power supply. For example, the absolute value of the supplied voltage may be under +/−100 V, less than +/−48 V, under +/−24 V, +/−15 V, +/−5 V, etc. Multiple supply voltages may be provided to various components of the welding power source 100. While the supply voltage to the welding power source 100 may be less than the nominal voltage in the low voltage mode, nominal supply voltages (e.g., 1.8V, 3.3V, 5V, etc.) may be provided to control circuitry and/or other logic circuitry to provide proper operating voltages for low-voltage circuitry. The service tool (800 of FIG. 8 or 900 of FIG. 9) provides one or more signals to the welding power source 100 to activate the soft-start feature. These signals may include an analog, digital or serial communication signals. A soft-start mode bypasses certain circuits of the welding power source 100, such as an arc control circuit 302, to allow operation of a subset of the circuits within the welding power source 100. Bypassing certain circuits of the welding power source 100 may be desirable to simplify the initial troubleshooting of the welding power source 100.

During the soft-start mode, certain checks, steps or features of a normal power up sequence of the welding power source 100 may be disabled, and certain other features may be enabled. For example, during the "soft-start" or "slow-start" mode of operation, the power up sequence may ignore a test of the magnitude of the DC bus voltage. Ignoring a test of the magnitude of the DC bus voltage allows a low voltage to be supplied to the AC power connection 202 (e.g., +5V, +15V, +24V, etc.) via a power lead 810. The operation of the boost circuit 208 and switched mode power supply 214 as well as one or more of the control power supply 216 or auxiliary power supply 218 may then be controlled manually via switches or controls (602 of FIG. 6, 708 of FIG. 7; 808 of FIG. 8) on the service tool 400. In some examples, multiple supply voltages may be provided to various components of the welding power source 100 via the power lead(s) 810. For example, various supply voltages may be provided to the boost circuit 208, the switched mode power supply 214, the control power supply 216, or the auxiliary power supply 218.

In some examples, manual control may not be required, but rather a built in algorithm steps through a sequence of test steps. The service tool (800 of FIG. 8 or 900 of FIG. 9) may provide guidance to a service technician via a LCD display 804. Guidance may include user readable instructions regarding indicators to look for, where to connect test leads 404, and instructions for repair or further troubleshooting if measured signals do not correlate with an expected or reference signal or waveform. In some examples, the service tool (800 of FIG. 8 or 900 of FIG. 9) communicates with a smartphone, laptop, or other external computing device 806, and provides guidance to a service technician via the smartphone, laptop, or other external computing device 806.

In some welding power sources, the soft-start mode is entered via operating a user interface of the welding power source 100. In some examples, the soft-start mode is entered by flipping a switch or manipulating another control on the welding power source 100. In such examples, the service tool (800 of FIG. 8 or 900 of FIG. 9) is then used to service or troubleshoot the welding power source 100 while the welding power source 100 is in the soft-start mode. The service tool (800 of FIG. 8 or 900 of FIG. 9) also provides the necessary low voltage power to operate the welding power source 100 in the soft-start mode.

The soft-start mode allows operation of the welding power source 100 under low power and low voltage conditions. Therefore, operation in the soft-start mode allows a service technician to verify an operational status of the various circuits of the welding power source 100 at a reduced voltage and power level. A test sequence may be followed such as first verifying operation of the switched-mode power supply circuit 214 at one input voltage level and comparing a welding output voltage to a predicted level based on the test voltage supplied. In addition, certain waveforms may be captured and compared as described above to a reference waveform. These waveforms may include power semiconductor waveforms such as IGBTs or other switches, power diodes such as the output diodes, etc. These waveforms are captured by the service tool 800 via test leads 404. These waveforms may also be communicated to a remote device for assistance in troubleshooting, for example to a smartphone, laptop, or other external computing device 806.

With reference to FIGS. 2 and 8, a further soft-start test step includes activating a boost circuit 208. The boost circuit 208 may be activated with the same voltage supplied to the AC power input 202, or with another voltage level. In some examples, a control 808 on the service tool 800 is manipulated to communicate to the boost control circuit 220 that the boost circuit should be activated. In some examples, the activation signal is supplied to the switched mode power supply control circuit 222 and further communicated to the boost control circuit 220 via a serial communication channel between the switched mode power supply control circuit 222 and boost control circuit 220.

The soft-start mode alters or skips certain steps in a power up sequence of the welding power source 100. In normal operation, these start-up steps generate a fault or halt the power up sequence when limited voltage is supplied to the power input 202. For example, a minimum expected boost current threshold may be modified to allow the boost circuit 208 to operate at the reduced input voltage level. The soft-start mode allows operation of the boost circuit 208 at reduced power and voltage levels. Operation at reduced power and voltage levels prevents failure of additional components if the boost circuit 208 has failed. Certain tests can be run in with the boost circuit 208 operating at reduced power and voltage levels, such as DC bus voltage measurements, waveform capture of the boost power semiconductors, etc.

In the soft-start mode, control power supply 216 or auxiliary power supply 218 may be enabled or activated and tested for proper operation at a reduce power and voltage level. For example, auxiliary power supply 218 (which may be for example, a wire feeder power supply) may be designed to provide +50 VDC when supplied with a normal full operating DC bus voltage. During the soft-start test mode, the auxiliary power supply 218 may be manually enabled via a control 808 on the service tool. Operation of the auxiliary power supply 218 under low voltage and low power conditions can then be verified. For example, rather than +50 VDC as an output voltage under normal conditions, a correctly functioning auxiliary power supply 218 may only provide +5 to +10 VDC at the reduced input voltage level supplied during the soft-start mode. The output of the auxiliary power supply 218 can be compared to a known expectation of output voltage as a determination of proper operation of the auxiliary power supply. Additional voltages and waveforms may be captured and compared to known reference waveforms to further verify proper operation.

Additional features and functions may be verified by interaction of the service tool 800 with built in features of the welding power source 100 while operating in a soft-start mode, including proper weld feedback signals and waveform generation. One test includes operating the welding power source with a known load resistance or short circuit across the output weld connections 106. In some examples, this known load or short circuit across the weld output 104 is provided by the service tool as part of a test sequence. In some examples, a technician may connect the known load or short circuit across the weld output 104.

An example test sequence to verify proper weld current generation and feedback of a welding power source 100 proceeds as follows. A source of low voltage input power supplied by the service tool 800 is supplied to the AC power input 202. The switched mode power supply control circuit 222 is activated while in a test mode that commands the switched-mode power supply circuit 214 to output a low current (e.g. 10-50 Amps) into a short circuit or other load. The feedback current is then measured by the switched mode power supply control circuit 222, the arc control 302, or both and compared to the expected value. The feedback current is communicated via a serial communication channel to the service tool 800 to display a test result. The service tool 800 displays instructions for fixing or troubleshooting the welding power source 100 if test criteria are not met, via the LCD 804.

Another test sequence that the service tool 800 may run on the welding power source 100 activates a mode where the switched-mode power supply circuit 214 generates a waveform pattern, rather than a fixed current level. This waveform is captured by test leads 404 of the service tool 800 and compared to an expected waveform. The expected waveform may be stored either within the control circuitry 212 of the welding power source 100 or within memory of the service tool 800. Generating waveform patterns and comparing the response of the welding power source 100 allows testing of additional components or features within the welding power source 100 such as dynamic output, inductance, etc.

A user interface built into the welding power source 100 may be used to provide results and feedback relative to various tests that may be conducted by the service tool 800. In some examples, indicators on the welding power source 100 itself provide visual feedback to a service technician. The control panel 112 may have LEDs 412 or digital displays 414 that respond to various tests provided by the service tool 800. The display 804 of the service tool 800 guides the service technician as to the meaning of the indicators (LEDs 412 or digital displays 414) for the given welding power source 100. For example, one or more LEDs 412 may flash or blink with a known pattern to provide feedback for troubleshooting.

In some examples, the service tool 800 determines a status or revision of the firmware embedded within the welding power source 100 by establishing a communication link via a control cable 704 or PCB harness 502. The firmware information may be used to correlate reference waveforms and signal levels to a particular firmware revision. The service tool 800 may also provide firmware upgrades by powering up the necessary control circuits of the control circuitry 212 of welding power source 100 and downloading new firmware to the control circuitry 212.

The service tool 800 may also communicate with the welding power source 100 and retrieve various system logs, status bits or values and other information that is routinely detected, measured and logged within the welding power source 100. This information may be used or displayed to provide further assistance in troubleshooting or servicing the welding power source 100. This information may also be communicated to a remote device 806, for example a smartphone or desktop computer, which then uses the information to troubleshoot the welding power source.

In some examples, the service tool 800 identifies the welding power source 100. Various methods may be used to identify the welding power source 100. For example, the service technician may input the specific welding power source 100 into the service tool 800 via an interface of the service tool 800. In some examples, the service tool 800 establishes a communication link with the control circuitry 212 of the welding power source 100, as explained above, and identifies the welding power source 100 via the communication link. Any other identification method may be used to identify the welding power source, including video recognition. In some examples, after identifying the welding power source, the test sequences run by the service tool 800 on the welding power source 100 is selected based on the identified welding power source. The reference responses are also selected based on the identified welding power source 100. In examples where a service technician may select the test sequences to run on the welding power source, the test sequences presented to the service technician on the display 804, the smartphone, or other portable computing device 806, may be selected based on the identified welding power source 100.

While example service tools are described above, any of the features, functions, structures, and/or other aspects of the individual examples may be combined into a service tool in accordance with aspects of this disclosure. Accordingly, the disclosure is not limited to the example service tools described above or methods described below, but instead encompass all service tools, systems, and/or methods falling within the scope of the claims.

FIG. 10 is a flow chart of an exemplary method 1000 of testing one or more circuits of a welding power source 100, for example the boost circuit 208 and/or the switched-mode power supply circuit 214, using the service tool (e.g., 800 of FIG. 8 or 900 of FIG. 9). The example method 1100 may be partially or completely implemented by executing machine readable instructions using the control circuit 906 and memory 908 of FIG. 9 and/or the control circuitry 212 of FIG. 2.

At block 1002, the service technician connects test leads 404 to the one or more circuits of the welding power source, for example the boost circuit 208, or the switched-mode power supply circuit 214. In some examples, the technician may connect a PCB harness to the control circuitry 212 of the welding power source, as shown in FIG. 5.

At block 1004, the service tool (800 of FIG. 8, or 900 of FIG. 9) supplies a low voltage power to the welding power source 100. At block 1006, the welding power source enters into a low voltage mode of operation. A control signal sent from the control circuit 906 of the service tool (800 of FIG. 8, or 900 of FIG. 9) to the control circuitry 212 may enter the welding power source 100 into the low voltage mode of operation. For example, the control signal may cause the control power supply 216 to override a lower voltage limit required for normal operation of the welding power source 100. In some examples, the welding power source 100 is programed such that receiving a low voltage at the input circuit 202, rather than the usual AC input, enters the welding power source into a low voltage mode of operation. In some examples, a technician enters the welding power source into a low voltage mode of operation using an interface on the welding power source 100, for example via manipulating a control on the welding power source 100.

At block 1008, the test sequence to run on the one or more circuits of the welding power source 100 is determined. In some examples, the service tool (800 of FIG. 8 or 900 of FIG. 9) has an interface which displays tests that the service tool (800 of FIG. 8 or 900 of FIG. 9) is capable of running on the welding power source 100. In some examples, the service tool is connected to a remote device 806, for example a smartphone. The technician selects a test sequence to run on the welding power source 100 from a selection of displayed test sequences on the remote device 806. Such a remote device 806 may also present instructions for the technician to connect the service tool (800 of FIG. 8 or 900 of FIG. 9) to the welding power source 100 for any particular test sequence. For example, the remote device may present user readable instructions for connecting the test leads 404 to the switched-mode power supply circuit 214. In some examples, the test sequence to run is selected based on the identified welding power source 100. As explained above, a welding power source may be identified, and in response to the identification of the welding power source, the service tool (800 of FIG. 8 or 900 of FIG. 9) selects a particular test sequence to run.

At block 1010, the service tool (e.g., 800 of FIG. 8 or 900 of FIG. 9) provides a test sequence to the circuit of the welding power source. For example, the service tool (e.g., 800 of FIG. 8 or 900 of FIG. 9) may activate a mode where the switched-mode power supply circuit 214 generates a waveform pattern. In some examples, the service tool (e.g., 800 of FIG. 8 or 900 of FIG. 9) commands the switched-mode power supply circuit 214 to output a low current into a short circuit or other known load. In some examples, the service tool (800 of FIG. 8 or 900 of FIG. 9) supplies a voltage signal to the boost pre-regulator circuit 208.

At block 1012, the service tool (800 of FIG. 8 or 900 of FIG. 9) monitors the response of the circuit to the test sequence. For example, the service tool (800 of FIG. 8 or 900 of FIG. 9) may monitor the response of the switched-mode power supply circuit 214 or of the boost circuit 208 to a test sequence provided in block 1010. At block 1014, the service tool 800 may display the response of the circuit on a display 804 of the service tool 800. In some examples, the response is communicated to a remote device 806 and displayed on the remote device 806. At block 1016 the monitored response of the circuit is compared to a reference response for the provided test sequence. The reference response may be stored in memory (802 of FIG. 8 or 908 of FIG. 9). In some examples, the reference response is also displayed on the display 804 of the service tool 800, or via the remote device 806, so that a technician can visually compare the reference response with the actual response.

At block 1018, the control circuitry of the service tool (800 of FIG. 8 or 900 of FIG. 9), for example the control circuit 906 of the service tool 900, determines whether the monitored response is normal or indicates an error. A normal response indicates that the tested circuit is operational for the tested circuit's intended purpose. For example, the control circuit 906 compares the monitored response of the switched mode power supply 214 or boost circuit 208 to the reference response stored in memory 908, and if the monitored response varies beyond an acceptable threshold, the control circuit 906 determines that the circuit is in error. An error may indicate that the circuit is defective or has faulted. If the control circuit 906 determines that the tested circuit is operating normally, then at block 1020, the service tool (800 of FIG. 8 or 900 of FIG. 9) displays to the technician via display 804 that the tested circuit passed the selected test sequence.

If the control circuit 906 determines that the tested circuit is in error, then at block 1022, the service tool (800 of FIG. 8 or 900 of FIG. 9) displays to the technician via display 804 that the tested circuit failed the selected test sequence. If the tested circuit failed the selected test sequence, then at block 1024, the service tool (800 of FIG. 8 or 900 of FIG. 9) displays via the display 804 user readable service instructions to guide the technician to either further test the failed circuit, or to fix the failed circuit. In some examples, the user readable instructions may be provided via the remote device 806.

FIG. 11 is a flow chart of an exemplary method 1100 of entering a welding power source 100 into a soft-start or low voltage mode. The example method 1100 may be used to implement block 1006 of FIG. 10 and/or the control circuit 906 and memory 908 of FIG. 9 and/or the control circuitry 212 of FIG. 2. The example method 1100 may be partially or completely implemented by executing machine readable instructions using the control circuit 906 and memory 908 of FIG. 9 and/or the control circuitry 212 of FIG. 2.

At block 1102, a technician connects power leads 810 to the AC input 202 of the welding power source 100. In some examples, the technician connects the power leads 810 directly to the control circuitry 212 of the welding power source. At block 1104, the technician connects the control cable 704 to the welding power source 100. In some examples, at block 1104, the technician connects a PCB harness 502 to the control circuitry of the welding power source. At block 1106, then service tool provides a low voltage power to the welding power source 100 via power leads 810. At block 1108, the control circuit 906 sends a signal to the control circuitry 212 commanding the welding power source to enter the soft-start mode. At block 1110, the control circuitry 212 commands the control power supply 216 to override the lower voltage limit required for normal operation under AC power conditions. The control power supply 216 then overrides the lower voltage limit. At block 1112, the welding power source 100 enters the soft-start low voltage mode.

FIG. 12 is a flow chart of an exemplary method 1200 of testing a boost circuit 208 while operating the welding power source 100 in a low voltage mode. The example method 1200 may be used to implement block 1010 of FIG. 10 and/or the control circuit 906 and memory 908 of FIG. 9 and/or the control circuitry 212 of FIG. 2. The example method 1200 may be partially or completely implemented by executing machine readable instructions using the control circuit 906 and memory 908 of FIG. 9 and/or the control circuitry 212 of FIG. 2.

At block 1202, the control circuitry 212 commands the boost control 220 to override normal boost fault conditions that would generate a fault when the welding power source 100 is operating under normal conditions. For example, a minimum expected boost current threshold may be modified to allow the boost circuit 208 to operate at the reduced voltage level. At block 1204, a low voltage is applied to the input of the boost circuit 208. The low voltage is supplied by the service tool 900 via the power lead 810 to the AC input 202 of the welding power source. The boost circuit 208 then receives the low voltage from the AC input 202.

At block 1206, the service tool 900 measures the output of the boost circuit. For example, a technician may connect test leads 404 to the DC bus 204 to measure the output of the boost circuit 208. In some examples, the test leads captures waveforms of the boost power semiconductors of the boost circuit 208. At block 1208, the control circuit 906 compares the measured output of the boost circuit 208 to a reference response. For example, the control circuit 906 may compare the voltage measured at the DC bus 204 to a reference voltage stored in memory 908. In some examples, the control circuit 906 compares a measured waveform of the boost semiconductors to reference waveforms stored in memory 908.

At block 1210, the control circuit 906 determines whether the deviation between the measured output and the reference response stored in memory 908 is greater than an acceptable threshold. If the deviation is not greater than an acceptable threshold, the control circuit 906 determines that the boost circuit 208 is operating normally. Then at block 1212, the service tool 800 of FIG. 8 indicates via the LCD 804 that the boost circuit is operating normally. At block 1210, if the deviation is greater than an acceptable threshold, the control circuit determines that the boost circuit 208 is not operating normally. Then at block 1214, the service tool 800 of FIG. 8 indicates via the LCD 804 that there is an error with the boost circuit 208.

FIG. 13 is a flow chart of an exemplary method 1300 of testing an auxiliary power supply 218 while operating the welding power source 100 in a low voltage mode. The example method 1300 may be used to implement block 1010 of FIG. 10 and/or the control circuit 906 and memory 908 of FIG. 9 and/or the control circuitry 212 of FIG. 2. The example method 1300 may be partially or completely implemented by executing machine readable instructions using the control circuit 906 and memory 908 of FIG. 9 and/or the control circuitry 212 of FIG. 2.

The auxiliary power supply may be used to provide power to a wire feeder 108 of the welding system 10. At block 1302, the control circuitry 212 commands the auxiliary power supply 218 to override normal fault conditions that would generate a fault when the welding power source 100 is operating under normal conditions. For example, a minimum expected auxiliary power supply current threshold may be modified to allow auxiliary power supply 218 to operate at the reduced voltage level. At block 1304, a low voltage is applied to the auxiliary power supply 218.

At block 1306, the service tool 900 measures the output of the auxiliary power supply via test leads 404. At block 1308, the control circuit 906 compares the measured output of the auxiliary power supply 218 to a reference response. For example, under normal conditions, the auxiliary power supply may be designed to provide +50 VDC when supplied with normal operating DC bus voltage. When supplied with low voltage during the soft-start mode, the output of the auxiliary power supply 218 may be +5 to +10 VDC. The control circuit 906 compares the voltage supplied by the auxiliary power source 218 to a reference voltage stored in memory 908.

At block 1310, the control circuit 906 determines whether the deviation between the measured voltage and the reference voltage stored in memory 908 is greater than an acceptable threshold. If the deviation is not greater than an acceptable threshold, the control circuit 906 determines that the auxiliary power supply 218 is operating normally. Then at block 1312, the service tool 800 of FIG. 8 indicates via the LCD 804 that the auxiliary power supply 218 is operating normally. At block 1310, if the deviation is greater than an acceptable threshold, the control circuit determines that the auxiliary power supply 218 is not operating normally. Then at block 1314, the service tool 800 of FIG. 8 indicates via the LCD 804 that there is an error with the auxiliary power supply 218.

FIG. 14 is a flow chart of an exemplary method 1400 of testing a switched mode power supply circuit 214 while operating the welding power source 100 in a low voltage mode. The example method 1400 may be used to implement block 1010 of FIG. 10 and/or the control circuit 906 and memory 908 of FIG. 9 and/or the control circuitry 212 of FIG. 2. The example method 1400 may be partially or completely implemented by executing machine readable instructions using the control circuit 906 and memory 908 of FIG. 9 and/or the control circuitry 212 of FIG. 2.

At block 1402, the technician applies a known load across the weld output 106. The service tool 800 may provide instructions to the technician to apply the known load to the weld output 106. In some examples, the known load is a short circuit. At block 1404, the switched mode power supply 214 is activated. The control circuit 906 sends a signal to the switched mode power supply control 222 to activate the switched mode power supply 214. At block 1406, the switched mode power supply 214 outputs a low current (e.g., 10-50 mAmps) into the known load.

At block 1408, the service tool (800 of FIG. 8 or 900 of FIG. 9) measures the output (i.e. the voltage or current) across the known load via the test leads 404. At block 1410, the control circuit 906 compares the measured output across the known load to a reference response stored in memory 908. At block 1412, the control circuit 906 determines whether the deviation between the measured output across the known load and the reference response stored in memory 908 is greater than an acceptable threshold. If the deviation is not greater than an acceptable threshold, the control circuit 906 determines that the switched mode power supply 214 is operating normally. Then at block 1414, the service tool 800 of FIG. 8 indicates via the LCD 804 that the switched mode power supply 214 is operating normally. At block 1412, if the deviation is greater than an acceptable threshold, the control circuit determines that the switched mode power supply 214 is not operating normally. Then at block 1416, the service tool 800 of FIG. 8 indicates via the LCD 804 that there is an error with the switched mode power supply 214.

FIG. 15 is a flow chart of an exemplary method 1500 of testing a switched mode power supply circuit 214 while operating the welding power source 100 in a low voltage mode. The example method 1500 may be used to implement block 1010 of FIG. 10 and/or the control circuit 906 and memory 908 of FIG. 9 and/or the control circuitry 212 of FIG. 2. The example method 1500 may be partially or completely implemented by executing machine readable instructions using the control circuit 906 and memory 908 of FIG. 9 and/or the control circuitry 212 of FIG. 2.

At block 1502, the technician applies a known load across the weld output 106. The service tool 800 may provide instructions to the technician to apply the known load to the weld output 106. In some examples, the known load is a short circuit. At block 1504, the switched mode power supply 214 is activated. The control circuit 906 sends a signal to the switched mode power supply control 222 to activate the switched mode power supply 214. The control circuit also commands the switched mode power supply control 222 to control the switched mode power supply 214 to generate a known waveform. At block 1506, the switched mode power supply 214 outputs a waveform pattern into the known load. At block 1508, the service tool (800 of FIG. 8 or 900 of FIG. 9) measures the response to the known waveform across the known load via the test leads 404. At block 1510, the control circuit 906 compares the measured response across the known load to a reference response stored in memory 908. At block 1512, the control circuit 906 determines whether the deviation between the measured response across the known load and the reference response stored in memory 908 is greater than an acceptable threshold. If the deviation is not greater than an acceptable threshold, the control circuit 906 determines that the switched mode power supply 214 is operating normally. Then at block 1514, the service tool 800 of FIG. 8 indicates via the LCD 804 that the switched mode power supply 214 is operating normally. At block 1512, if the deviation is greater than an acceptable threshold, the control circuit determines that the switched mode power supply 214 is not operating normally. Then at block 1516, the service tool 800 of FIG. 8 indicates via the LCD 804 that there is an error with the switched mode power supply 214.

Feedback, as used herein, includes a signal indicative of or responsive to an output or intermediate signal, which is provided to the controller and control decisions are made in response thereto. Feedback circuit, as used herein, includes a circuit that provides a signal indicative of or responsive to an output or intermediate signal. Feedback signal, as used herein, includes one or more signals that provide information about one or more parameters being monitored, such as output current and output voltage.

As used herein, a welding power source refers to any device capable of, when power is applied thereto, supplying welding, cladding, plasma cutting, induction heating, laser (including laser welding, laser hybrid, and laser cladding), carbon arc cutting or gouging and/or resistive preheating, including but not limited to transformer-rectifiers, inverters, converters, resonant power supplies, quasi-resonant power supplies, switch-mode power supplies, etc., as well as control circuitry and other ancillary circuitry associated therewith.

Control circuitry, as used herein, includes digital and analog circuitry, discrete or integrated circuitry, microprocessors, DSPs, etc., software, hardware and firmware, located on one or more boards, that form part or all of a controller, and are used to control a welding process, or a device such as a power source or wire feeder.

As utilized herein the terms "circuits" and "circuitry" refer to physical electronic components, any analog and/or digital components, power and/or control elements, such as a microprocessor or digital signal processor (DSP), or the like, including discrete and/or integrated components, or portions and/or combination thereof (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code.

As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

As utilized herein, a PCB harness includes a wiring harness that is able to be easily connected, disconnected, and reconnected without damaging the connections of the printed circuit board.

Welding-type power supply and welding power source, as used herein, refers to a power supply that can provide welding-type power.

As utilized herein, "and/or" means any one or more of the items in the list joined by "and/or". As an example, "x and/or y" means any element of the three-element set $\{(x), (y), (x, y)\}$. In other words, "x and/or y" means "one or both of x and y". As another example, "x, y, and/or z" means any element of the seven-element set $\{(x), (y), (z), (x, y), (x, z), (y, z), (x, y, z)\}$. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations.

While the present method and/or system has been described with reference to certain implementations, it will be understood by those skilled in the art that various changes may be made and equivalents may be substituted without departing from the scope of the present method and/or system. For example, block and/or components of disclosed examples may be combined, divided, re-arranged, and/or otherwise modified. In addition, many modifications may be made to adapt a particular situation or material to the teachings of the present disclosure without departing from its scope. Therefore, the present method and/or system are not limited to the particular implementations disclosed. Instead, the present method and/or system will include all implementations falling within the scope of the appended claims, both literally and under the doctrine of equivalents.

What is claimed is:

1. A service tool for servicing a welding-type power supply, the service tool comprising:
   test leads configured to connect to one or more circuits in the welding-type power supply;
   a power supply circuit configured to supply a low voltage power to the welding-type power supply operating in a low voltage mode of operation via two or more power leads; and
   a control circuit configured to measure one or more aspects of the one or more circuits in the welding-type power supply via the test leads while the welding-type power supply is in the low voltage mode of operation, the control circuit being configured to:
provide a test sequence to a first one of the one or more circuits in the welding-type power supply via the test leads,
monitor a response of the welding-type power supply to the test sequence via the test leads, and
compare the response to a reference response to determine whether the one or more circuits are operating properly.

2. The service tool of claim 1, wherein the control circuit is configured to identify one or more components of the welding-type power supply that are not operating properly based on the comparison of the response and reference response.

3. The service tool of claim 2, wherein the control circuit is configured to output, via at least one of a user interface or communications circuitry, user-readable service instructions based on identification of the one or more components of the welding-type power supply that are not operating properly.

4. The service tool of claim 2, wherein the control circuit is configured to output, via at least one of a user interface or communications circuitry, user-readable instructions for connecting the service tool to the welding-type power supply based on identification of the one or more components of the welding-type power supply that are not operating properly.

5. The service tool of claim 1, wherein the control circuit is configured to output, via at least one of a user interface or communications circuitry, the results of the test sequence.

6. The service tool of claim 1, wherein the control circuit is configured to output, via at least one of a user interface or communications circuitry, a reference response signal representative of the reference response and a response signal representative of the response.

7. The service tool of claim 1, wherein the test sequence comprises a preset input voltage, the first of the one or more circuits comprises a switched mode power supply of the welding-type power supply, and the response comprises the output voltage of the switched mode power supply.

8. The service tool of claim 1, wherein the test sequence comprises one or more input waveforms, and wherein the response comprises one or more output waveforms detected with the test leads at one or more outputs of the one or more circuits of the welding-type power supply.

9. The service tool of claim 1, wherein the control circuit is further configured to determine an identity of the welding-type power supply, and wherein the test sequence or the reference response is selected based on the identity of the welding-type power supply.

10. The service tool of claim 1 further comprising a battery configured to supply power to the power supply circuit.

11. The service tool of claim 1, wherein the control circuit is configured to receive, from at least one of a user interface or communications circuitry, a selection of the test sequence to provide to the welding-type power supply.

12. The service tool of claim 1, wherein the power supply circuit is configured to provide low voltage operational power to at least one of a boost pre-regulator power circuit of the welding-type power supply, a switched mode power supply of the welding-type power supply, or a commutator of the welding-type power supply.

13. The service tool of claim 1, wherein the service tool is configured to provide a predetermined load across output connections of the welding-type power supply, and wherein the test sequence comprises operating the welding-type power supply with the predetermined load.

14. The service tool of claim 1 further comprising communications circuitry configured to connect with one of a smartphone, tablet, or personal computer, the control circuit configured to receive an input via the communications circuitry.

15. The service tool of claim 1, wherein the control circuit is configured to cause the welding-type power supply to enter into the low voltage mode of operation by overriding a lower limit of a controller of the welding-type power supply.

16. The service tool of claim 15, wherein the control circuit is configured to control the power supply circuit to output power via the power leads to supply low voltage power to the welding-type power supply when the welding-type power supply is operating in the low voltage mode of operation.

17. A method comprising:
connecting test leads to one or more circuits in a welding-type power supply;
supplying a low voltage power to the welding-type power supply operating in a low voltage mode of operation, via two or more power leads; and
measuring one or more aspects of the one or more circuits in the welding-type power supply, via control circuitry connected to the test leads, while the welding-type power supply is in a low voltage mode of operation.

18. The method of claim 17, further comprising:
providing a test sequence to a first one of the one or more circuits in the welding-type power supply via the test leads;
monitoring a response of the welding-type power supply to the test sequence via the control circuitry; and
comparing, via the control circuitry, the monitored response to a reference response to determine whether the one or more circuits are operating properly.

19. The method of claim 18, wherein providing a test sequence comprises inputting waveforms into selected circuits of the welding-type power supply, and wherein the monitoring the response comprises measuring waveforms at the outputs of the selected circuits of the welding-type power supply.

20. The method of claim 18, further comprising determining an identity of the welding-type power supply via the control circuitry, the test sequence and the reference response being selected based on the identity of the welding-type power supply.

* * * * *